US011665485B2

(12) United States Patent
Ho

(10) Patent No.: US 11,665,485 B2
(45) Date of Patent: May 30, 2023

(54) MICRO-ELECTRO-MECHANICAL SYSTEM ACOUSTIC SENSOR, MICRO-ELECTRO-MECHANICAL SYSTEM PACKAGE STRUCTURE AND METHOD FOR MANUFACTURING THE SAME

(71) Applicant: UPBEAT TECHNOLOGY Co., Ltd, New Taipei (TW)

(72) Inventor: Hsien-Lung Ho, New Taipei (TW)

(73) Assignee: UPBEAT TECHNOLOGY CO., LTD, New Taipei (TW)

( * ) Notice: Subject to any disclaimer, the term of this patent is extended or adjusted under 35 U.S.C. 154(b) by 3 days.

(21) Appl. No.: 17/488,071

(22) Filed: Sep. 28, 2021

(65) Prior Publication Data

US 2022/0116715 A1 Apr. 14, 2022

Related U.S. Application Data

(60) Provisional application No. 63/089,053, filed on Oct. 8, 2020.

(30) Foreign Application Priority Data

Apr. 20, 2021 (TW) .................... 110114131

(51) Int. Cl.
*H04R 19/04* (2006.01)
*H04R 7/04* (2006.01)
(Continued)

(52) U.S. Cl.
CPC ............. *H04R 19/04* (2013.01); *B81B 3/007* (2013.01); *B81C 1/00658* (2013.01); *H04R 1/04* (2013.01);
(Continued)

(58) Field of Classification Search
CPC ... H04R 7/16; H04R 7/18; H04R 7/20; H04R 19/005; H04R 2201/003; B81B 2201/0257; B81B 2203/0307
See application file for complete search history.

(56) References Cited

U.S. PATENT DOCUMENTS 7,386,136 B2 * 6/2008 Ohbayashi ........... H04R 19/005
381/174
8,340,328 B2 * 12/2012 Wang ................... H04R 19/005
381/175

(Continued)

FOREIGN PATENT DOCUMENTS

CN 110546965 A 12/2019
WO 2021000163 A1 1/2021

OTHER PUBLICATIONS

Communication corresponding to Taiwan Application No. 110114131 and issued by Taiwan Intellectual Property Office dated Dec. 7, 2021, 4 pages.

*Primary Examiner* — Ryan Robinson
(74) *Attorney, Agent, or Firm* — Innovation Counsel LLP

(57) ABSTRACT

A MEMS acoustic sensor includes a substrate, a back plate, a diaphragm, a dielectric layer and a connecting portion. The diaphragm is disposed between the substrate and the back plate and includes a vibration portion. The dielectric layer is formed between the substrate and the diaphragm and has a cavity corresponding to the vibrating portion. The connecting portion is located in the cavity and connects the vibrating portion and the substrate.

17 Claims, 22 Drawing Sheets

(51) Int. Cl.
  *H04R 7/18* (2006.01)
  *H04R 1/04* (2006.01)
  *H04R 31/00* (2006.01)
  *B81B 3/00* (2006.01)
  *B81C 1/00* (2006.01)

(52) U.S. Cl.
  CPC ............... *H04R 7/04* (2013.01); *H04R 7/18* (2013.01); *H04R 31/003* (2013.01); *H04R 31/006* (2013.01); *B81B 2201/0257* (2013.01); *B81B 2203/019* (2013.01); *B81B 2203/0127* (2013.01); *H04R 2201/003* (2013.01)

(56) References Cited

U.S. PATENT DOCUMENTS

| | | | | |
|---|---|---|---|---|
| 8,374,364 | B2 * | 2/2013 | Kasai | H04R 19/005 381/174 |
| 8,461,655 | B2 * | 6/2013 | Klein | B81C 1/00103 359/290 |
| 8,787,601 | B2 * | 7/2014 | Suzuki | B81B 3/0072 381/174 |
| 8,942,394 | B2 * | 1/2015 | Conti | H04R 31/00 381/174 |
| 8,946,831 | B2 * | 2/2015 | Liu | B81C 1/00523 257/414 |
| 9,438,972 | B2 * | 9/2016 | Wang | B81B 7/0061 |
| 9,516,428 | B2 * | 12/2016 | Dehe | B81C 1/00158 |
| 9,544,697 | B2 * | 1/2017 | Uchida | H04R 19/04 |
| 9,661,411 | B1 * | 5/2017 | Han | H04R 31/006 |
| 9,738,509 | B2 * | 8/2017 | Schelling | B81B 3/0072 |
| 9,807,531 | B2 * | 10/2017 | Yoo | H04R 31/00 |
| 10,322,481 | B2 * | 6/2019 | Dehe | B81B 3/0072 |
| 10,555,089 | B2 * | 2/2020 | Inoue | H04R 19/005 |
| 10,721,576 | B2 * | 7/2020 | Zhang | B81C 1/00476 |
| 10,785,557 | B2 * | 9/2020 | Park | B81B 1/00015 |
| 11,206,494 | B2 * | 12/2021 | Lee | H04R 1/04 |
| 11,212,617 | B2 * | 12/2021 | Duan | H04R 17/02 |
| 11,214,483 | B2 * | 1/2022 | Rasmussen | B81C 1/00182 |
| 11,265,641 | B2 * | 3/2022 | Pedersen | H04R 1/1041 |
| 11,267,696 | B2 * | 3/2022 | Nagarajan | B81B 3/0086 |
| 11,317,179 | B2 * | 4/2022 | Yoo | H04R 19/04 |
| 2013/0136291 | A1 * | 5/2013 | Lee | H04R 19/005 381/355 |
| 2013/0163790 | A1 * | 6/2013 | Shimizu | H04R 1/38 381/122 |
| 2015/0230011 | A1 * | 8/2015 | Inoue | H04R 19/005 381/162 |
| 2020/0017357 | A1 * | 1/2020 | Kim | H04R 19/04 |
| 2020/0196065 | A1 * | 6/2020 | Pedersen | H04R 19/005 |
| 2022/0155073 | A1 * | 5/2022 | Deng | G01C 19/5712 |
| 2022/0256292 | A1 * | 8/2022 | Naderyan | H04R 19/04 |
| 2022/0289556 | A1 * | 9/2022 | Cheng | B81B 7/02 |

* cited by examiner

MICRO-ELECTRO-MECHANICAL SYSTEM ACOUSTIC SENSOR, MICRO-ELECTRO-MECHANICAL SYSTEM PACKAGE STRUCTURE AND METHOD FOR MANUFACTURING THE SAME

This application claims the benefit of U.S. provisional application Ser. No. 63/089,053, filed Oct. 8, 2020, and Taiwan application Serial No. 110114131, filed Apr. 20, 2021, the subject matters of which are incorporated herein by references.

BACKGROUND OF THE INVENTION

Field of the Invention

The invention relates in general to a micro-electro-mechanical system acoustic sensor, micro-electro-mechanical system package structure and method for manufacturing the same.

Description of the Related Art

Voice communication systems and speech recognition systems typically use acoustic microphones to pick up a user's speech via the sound waves produced by the user talking. An in-the-ear microphone system of the current technology still simultaneously uses both a bone and tissue vibration sensing transducer (to respond to bone-conducted lower speech frequency voice sounds) and a band limited acoustical microphone (to detect the weaker airborne higher speech frequency sounds) within the ear canal. The vibration sensing transducer can be an accelerometer, which can be mounted firmly to an inside wall of a housing of an earphone by an appropriate cement or glue, or by a friction fit.

SUMMARY OF THE INVENTION

The present invention relates to a multi-arm device capable of resolving the above problems.

According to one embodiment of the present invention, a micro-electro-mechanical system (MEMS) acoustic sensor is provided. The MEMS acoustic sensor includes a substrate, a back plate, a diaphragm, dielectric layer and a connecting portion. The diaphragm is disposed between the substrate and the back plate and includes a vibrating portion. The dielectric layer is formed between the substrate and the diaphragm and has a first cavity corresponding to the vibrating portion. The connecting portion is disposed within the first cavity and connects the vibrating portion with the substrate.

According to another embodiment of the present invention, a MEMS package structure is provided. The MEMS package structure includes a carrier plate and a MEMS acoustic sensor. The MEMS acoustic sensor is disposed on the carrier plate. The MEMS acoustic sensor includes a substrate, a back plate, a diaphragm, dielectric layer and a connecting portion. The diaphragm is disposed between the substrate and the back plate and includes a vibrating portion. The dielectric layer is formed between the substrate and the diaphragm and has a first cavity corresponding to the vibrating portion. The connecting portion is disposed within the first cavity and connects the vibrating portion with the substrate.

According to another embodiment of the present invention, a manufacturing method of a MEMS acoustic sensor is provided. The manufacturing method includes the following steps: a dielectric material layer is formed on a substrate layer; a diaphragm is formed on the dielectric material layer; a back plate is formed on the diaphragm, wherein the diaphragm is located between the substrate layer and the back plate and comprises a vibrating portion; a second cavity is formed on the substrate layer to form a substrate, wherein the second cavity exposes the dielectric material layer; and a portion of the dielectric material layer is removed through the second cavity of the substrate to form a dielectric layer and a connecting portion, wherein the dielectric layer is located between the substrate and the diaphragm and has a first cavity corresponding to the vibrating portion, and the connecting portion is located within the first cavity and connecting the vibrating portion and the substrate.

The above and other aspects of the invention will become better understood with regard to the following detailed description of the preferred but non-limiting embodiment (s). The following description is made with reference to the accompanying drawings.

DETAILED DESCRIPTION OF THE INVENTION

Figure 1A:
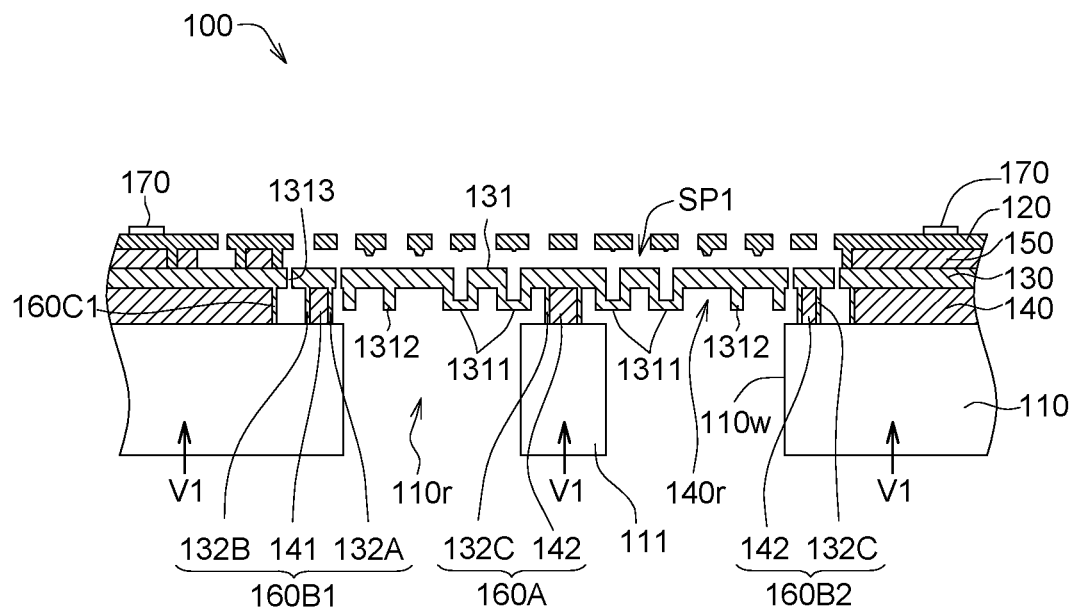
FIG. 1A shows a schematic diagram of a MEMS acoustic sensor according to an embodiment of the present invention along direction 1A-1A'.
Figure 1B:
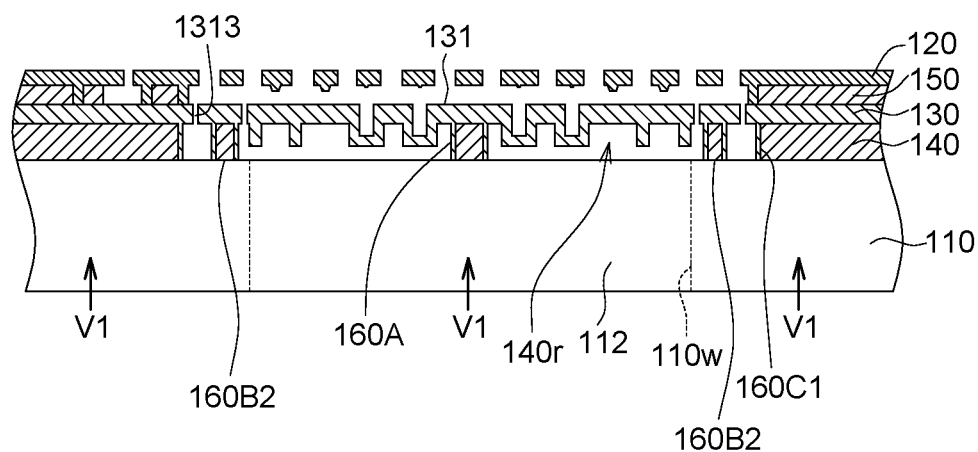
FIG. 1B shows a schematic diagram of a partial cross-sectional view of the MEMS acoustic sensor according to an embodiment of the present invention along direction 1B-1B'.
Figure 1C:
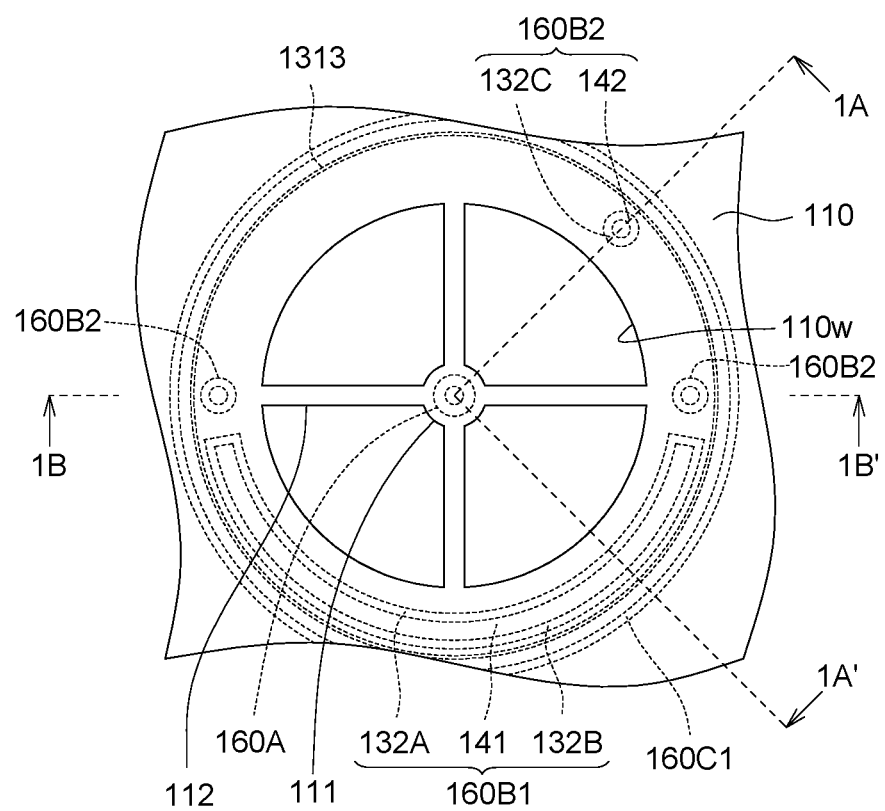
FIG. 1C shows a schematic diagram of a top view of the substrate of the MEMS acoustic sensor of FIG. 1A.

Referring to FIGS. 1A to 1C. FIG. 1A shows a schematic diagram of a micro-electro-mechanical system (MEMS) acoustic sensor 100 according to an embodiment of the present invention along direction 1A-1A' (the direction 1A-1A' is shown in FIG. 1C), FIG. 1B shows a schematic diagram of a partial cross-sectional view of the MEMS acoustic sensor 100 according to an embodiment of the present invention along direction 1B-1B' (direction 1B-1B' is shown in FIG. 1C), and FIG. 1C shows a schematic diagram of a top view of the substrate 110 of the MEMS acoustic sensor 100 of FIG. 1A (the diaphragm 130 and the dielectric layer 140 are shown in FIG. 1C with dashed lines).

The MEMS acoustic sensor 100 could be applied to vibration detectors, microphones, voice receiving device, etc., for example. The MEMS acoustic sensor 100 or the MEMS packaging structure using the same could be disposed on items that could performs vibration analysis based on received vibrations (for example, generated by audio, vibration), such as earphones, automobiles, wheels, home appliances, industrial instruments, etc.

The MEMS acoustic sensor 100 includes a substrate 110, a back plate 120, a diaphragm 130, dielectric layers 140 and 150, at least one connecting portion (for example, connecting portions 160A, 160B1 and 160B2, a position-position-limiting portion 160C1 and the electrode layer 170. The diaphragm 130 is disposed between the substrate 110 and the back plate 120 and includes a vibrating portion 131. The dielectric layer 140 is formed between the substrate 110 and the diaphragm 130 and has a first cavity 140r corresponding to the vibrating portion 131. The connecting portions 160A, 160B1 and 160B2 and the position-limiting portion 160C1 are located within the first cavity 140r and connect the vibrating portion 131 with the substrate 110. As a result, the external signal source V1 could be transmitted to the diaphragm 130 through the connecting portion to make the diaphragm 130 vibrate up and down. The external signal source V1 is, for example, a vibration wave. The external signal source V1 could be transmitted through solid (or physical medium) or air to the diaphragm 130. In the present embodiment, the external signal source V1 could be transmitted to the diaphragm 130 through the substrate 110 (referred to as solid conduction).

The substrate 110 is, for example, a silicon substrate, a silicon wafer or other suitable semiconductor materials, but the embodiment of the present invention is not limited thereto. The back plate 120 and the diaphragm 130 could include polysilicon materials, but the embodiment of the present invention is not limited thereto. The dielectric layers 140 and 150 are, for example, oxide layers. The dielectric layer 150 is formed between the back plate 120 and the diaphragm 130 to form a space SP1 between the back plate 120 and the diaphragm 130. When the external signal source V1 is transmitted to the MEMS acoustic sensor 100, the external signal source V1 could be transmitted to the diaphragm 130 through the connecting portion, so that the diaphragm 130 could vibrate relative to the back plate 120 in the interval SP1. The space SP1 could be filled with air, and thus the space SP1 could be called an air gap. The electrode layer 170 could be electrically connect the diaphragm 130 with the back plate 120. When the external signal source V1 is transmitted to the MEMS acoustic sensor 100, distance between the diaphragm 130 and the back plate 120 changes with the vibration (the capacitance value changes), and the corresponding voltage signal is transmitted to a process (not shown) through the electrode layer 170, wherein the processor analyzes/processes the voltage signal and accordingly executes corresponding action/function.

As shown in FIG. 1A, the external signal source V1 is transmitted to the diaphragm 130 through the substrate 110, the connection portion and the dielectric layer 140 in order. The connecting portion connecting the substrate 110 with the diaphragm 130 serves as an intermediate station for the external signal source V1 to be transmitted to the diaphragm 130, and plays a key role in the sensitivity of the MEMS acoustic sensor 100 to detect or sense the external signal source V1.

As shown in FIGS. 1A and 1C, the substrate 110 has a second cavity 110r, and includes a carrier portion 111 and at least one protrusion 112. The protrusion 112 extends from an inner sidewall 110w of the second cavity 110r toward and connects the carrier portion 111. The protrusion 112 could increase the overall strength of the substrate 110 and improve the yield of subsequent packaging processes. Furthermore, in the subsequent packaging process, the MEMS acoustic sensor 100 will endure a certain external force when it is disposed on a carrier plate. Therefore, the MEMS acoustic sensor 100 with sufficient strength could be safely disposed on the carrier plate. In another embodiment, if there is no consideration of strength, the substrate 110 could also omit the protrusion 112.

In addition, the geometric structure of the vibration portion 131 could adjust/change the stiffness of the diaphragm 130 to obtain characteristics of desired vibration detection, such as sensitivity at different vibration frequencies and/or increase the detection bandwidth. Specifically, as shown in FIG. 1A, the vibrating portion 131 includes at least one stiffness adjustment structure which is, for example, at least one protruding structure or at least one hollow structure, wherein the protruding structure includes, for example, rib (strengthen the stiffness to avoid warping of the diaphragm), protruding point (strengthen the stiffness to avoid warping of the diaphragm), corrugation layer (weaken the stiffness, like a spring, etc.), and the hollow structure includes blind hole or through hole, etc. (weak the stiffness, and could release the stress to make the vibration be easily transmitted to the diaphragm 130). The embodiment of the present invention does not limit the shape, number, and/or size of the protruding structure and/or the hollow structure. The hollow structure could be a closed ring (such as the through hole 1313 in FIG. 1C) or an open ring.

Figure 10:
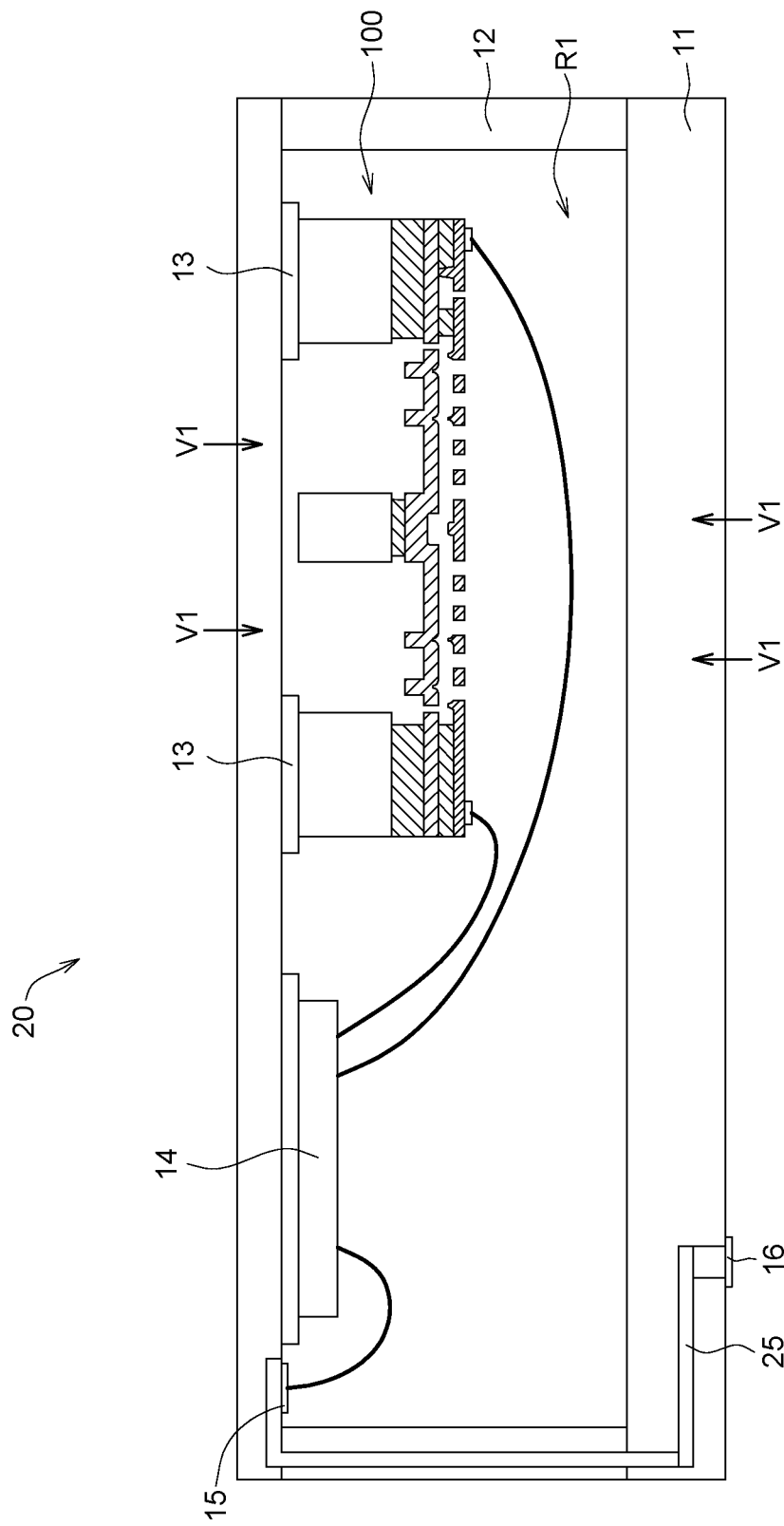
FIG. 10 shows a cross-sectional view of a MEMS package structure according to another embodiment of the present invention.

In the present embodiment, as shown in FIG. 1A, the vibrating portion 131 includes a corrugation layer 1311, a rib 1312 and through holes 1313, etc., wherein the through holes 1313 are, for example, in the form of a closed ring (viewed from the perspective of FIG. 10). Through the stiffness adjustment structure, the stiffness of the diaphragm 130 could be adjusted/changed for obtaining the expected characteristics of the MEMS acoustic sensor 100, such as the sensitivity in different vibration frequencies and/or increasing the detection bandwidth. In addition, the greater the number of protruding structures and/or the larger the distribution area of protruding structures is, the greater the stiffness of the substrate 110 is; on the contrary, the less the number of protruding structures and/or the less the distribution area of protruding structures is, the less the stiffness of the substrate 110 is. In addition, the greater the number of hollow structures and/or the larger the distribution area of hollow structures is, the lower the stiffness of the substrate 110 is; on the contrary, the less the number of hollow structures and/or the less the distribution area of hollow structures is, the greater the stiffness of the substrate 110 is. In another embodiment, the diaphragm 130 or the vibrating portion 131 could also be a flat diaphragm, that is, the diaphragm 130 or the vibrating portion 131 could not include any grooves, through holes, and/or protruding structures.

In addition, the design of the connecting portion could adjust/change the stiffness of the diaphragm 130, so that the MEMS acoustic sensor 100 meets the expected characteristics, such as sensitivity in different vibration frequencies and/or increases detection bandwidth. In addition, at least a portion of all the connecting portions in the embodiment of the present invention could be regarded as anchors which provide the function of supporting/fixing the diaphragm 130. In addition, the greater the number of connecting portions and/or the larger the distribution area of connecting portions is, the greater the stiffness of the diaphragm 130 or the vibrating portion 131 is; on the contrary, the less the number of connecting portions and/or the less the distribution area of connecting portions is, the less the stiffness of the diaphragm 130 or the vibrating portion 131 is.

In terms of geometric shapes, as shown in FIGS. 1A and 10, the connecting portion 160A and the connecting portion 160B2 are, for example, columns, such as cylinders. The connecting portion 160B1 is, for example, a ring-shaped column body which could surround the connecting portion 160A. The position-limiting portion 160C1 is, for example, a ring-shaped column, such as a closed ring-shaped column or an open ring-shaped column.

In terms of position, as shown in FIGS. 1A and 10, the connecting portion could correspond to any area of the vibrating portion 131 in position. For example, the connecting portion 160A is located at a middle area of the vibrating portion 131, and the connecting portions 160B1 and 160B2 could be located at an edge area of the vibrating portion 131.

In terms of structure, as shown in FIGS. 1A and 1C, the position-limiting portion 160C1 is, for example, a solid portion, which is formed of, for example, a single material, such as a material of the diaphragm 130. The connecting portion 160B1 is, for example, a multi-layer structure, which includes a first covering portion 132A, a second covering portion 132B and a supporting portion 141, wherein the first covering portion 132A and the second covering portion 132B respectively cover opposite two sides of the supporting portion 141. The connecting portions 160A and 160B2 each is, for example, a multi-layer structure, which includes a covering portion 132C and a supporting portion 142, wherein the covering portion 132C covers the supporting portion 142. The position of the position-limiting portion 160C1 could determine the position of the sidewall of the dielectric layer 140.

In terms of material, the connecting portion could include a material of the dielectric layer 140 and/or a material of the diaphragm 130. For example, for the connecting portion 160A, the supporting portion 142 of the connecting portion 160A is a portion of the dielectric layer 140 (the material is the same), and the covering portion 132C is a portion of the diaphragm 130 (the material is the same), wherein the supporting portion 142 and the electrical layer 140 are in the same layer structure (or, an integrally formed structure), and the covering portion 132C and the diaphragm 130 are in the same layer structure (or, an integrally formed structure). For the connecting portion 160B1, the connecting portion 160B1 is composed of a portion of the dielectric layer 140 and a portion of the diaphragm 130, for example, the first covering portion 132A and the second covering portion 132B are a portion of the diaphragm 130 (the same material), the first covering portion 132A, the second covering portion 132B and the diaphragm 130 could be in the same layer structure (or an integrally formed structure), and the supporting portion 141 is a portion of the dielectric layer 140 (the material is the same), and the supporting portion 141 and the dielectric layer 140 could be in the same layer structure (or, an integrally formed structure). The connecting portion 160B2 is made of a material similar to that of the connecting portion 160A, and it will not be repeated here. In addition, the position-limiting portion 160C1 is, for example, a portion of the diaphragm 130 (the material is the same), and the position-limiting portion 160C1 and the diaphragm 130 could be in the same layer structure (or an integrally formed structure).

The embodiment of the present invention does not limit the design of the connecting portion in shape, position, material, number of layers (single layer or multiple layers) and/or size, as long as the MEMS acoustic sensor 100 meets the expected characteristics. The MEMS acoustic sensor 100 could include at least one connection portion, wherein at least two of the several connection portions could have completely the same, partly the same or different designs.

Figure 2A:
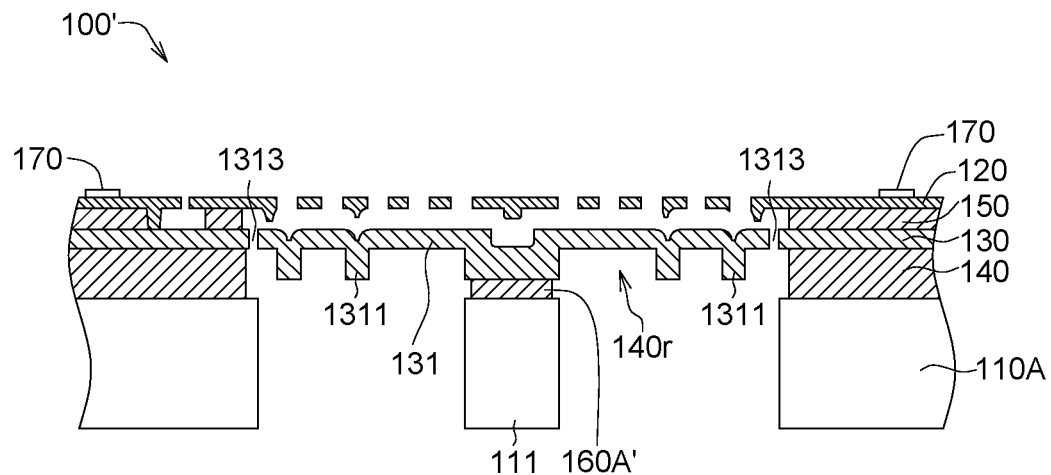
FIG. 2A shows a schematic diagram of a partial cross-sectional view of a MEMS acoustic sensor according to another embodiment of the present invention along direction 2A-2A'.
Figure 2B:
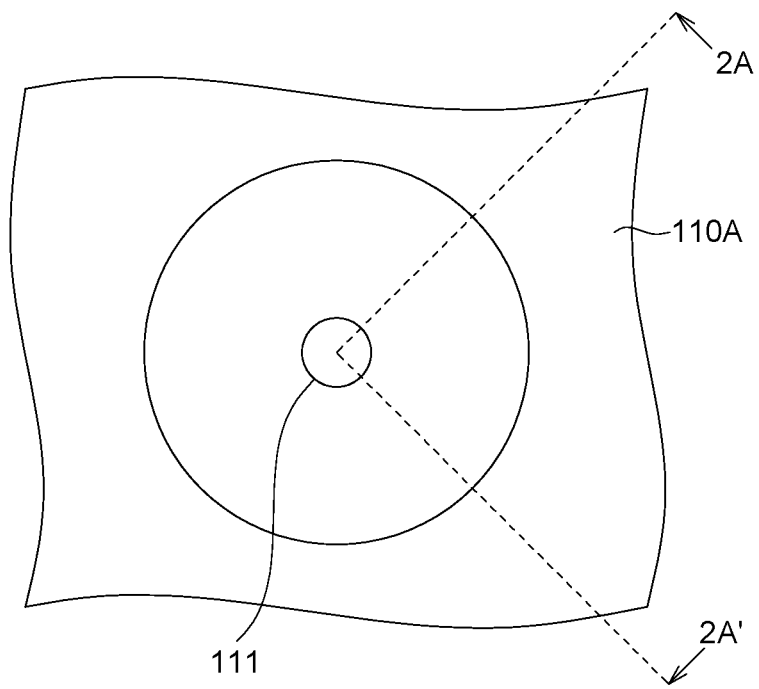
FIG. 2B shows a schematic diagram of a top view of the substrate of the MEMS acoustic sensor of FIG. 2A.

Referring to FIGS. 2A to 2B. FIG. 2A shows a schematic diagram of a partial cross-sectional view of a MEMS acoustic sensor 100' according to another embodiment of the present invention along direction 2A-2A' (the direction 2A-2A' is shown in FIG. 2B), and FIG. 2B shows a schematic diagram of a top view of the substrate 210 of the MEMS acoustic sensor 100' of FIG. 2A.

The MEMS acoustic sensor 100' could be applied to vibration detectors, microphones, voice receiving device, etc., for example. The MEMS acoustic sensor 100' or the MEMS packaging structure using the same could be disposed on items that could performs vibration analysis based on received vibrations (for example, generated by audio, vibration), such as earphones, automobiles, wheels, home appliances, industrial instruments, etc.

The MEMS acoustic sensor 100' includes a substrate 110A, the back plate 120, the diaphragm 130, the dielectric layers 140 and 150, at least one connecting portion (for example, a connecting portion 160A') and the electrode layer 170. The diaphragm 130 is disposed between the substrate 110A and the back plate 120 and includes the vibration portion 131. The dielectric layer 140 is formed between the substrate 110A and the diaphragm 130 and has a first cavity 140 $r$ corresponding to the vibration portion 131. The connecting portion 160A' is located within the first cavity 140r and connects the vibrating portion 131 with the carrier portion 111 of the substrate 110A. As a result, the external signal source V1 could be transmitted to the diaphragm 130 through the connecting portion 160A', such that the diaphragm 130 vibrates up and down. In the present embodiment, when the carrier portion 111 is vacant underneath, the external signal source V1 will vibrate the carrier portion 111 (generating acceleration), and such vibration is transmitted to the diaphragm 130 through the connecting portion 160A'.

The MEMS acoustic sensor 100' has technical features similar to or the same as that of the aforementioned MEMS acoustic sensor 100, except that the MEMS acoustic sensor 100' could omit one of some of the connecting portions 160A, 160B1 and 160B2, for example, the connection portions 160B1 and 160B2 could be omitted, and the connection portion 160A' has the structure different from that of the connection portion 160A of the MEMS acoustic sensor 100, and the substrate 110A could omit the protrusion 112.

As shown in FIG. 2A, compared to the connecting portion 160A, the connecting portion 160A' of this embodiment could omit the covering portion 132C which is a portion of the diaphragm 130 (the same material), and the covering portion 132C and the diaphragm 130 are in the same layer structure (or, an integrally formed structure).

Figure 3A:
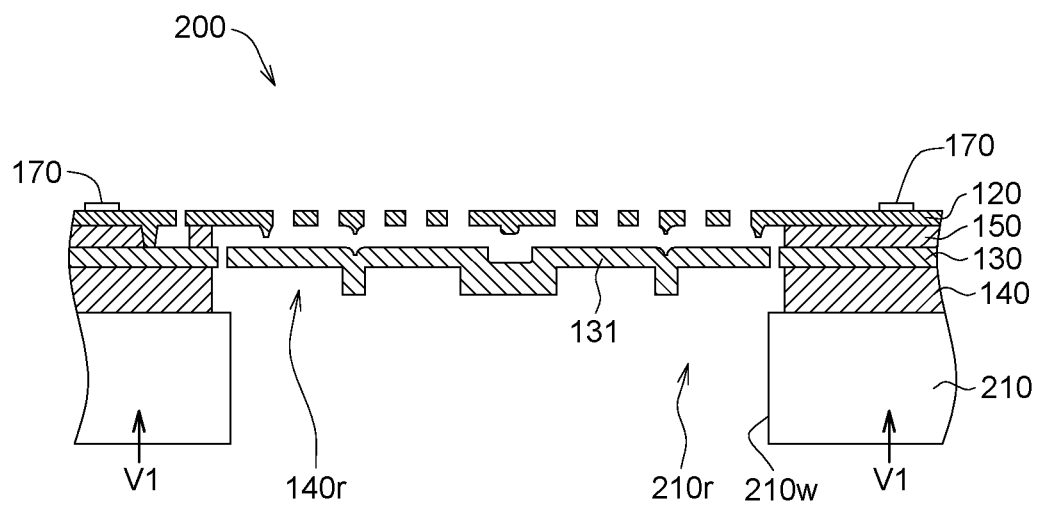
FIG. 3A shows a schematic diagram of a partial cross-sectional view of a MEMS acoustic sensor according to another embodiment of the present invention along directions 3A-3A'.
Figure 3B:
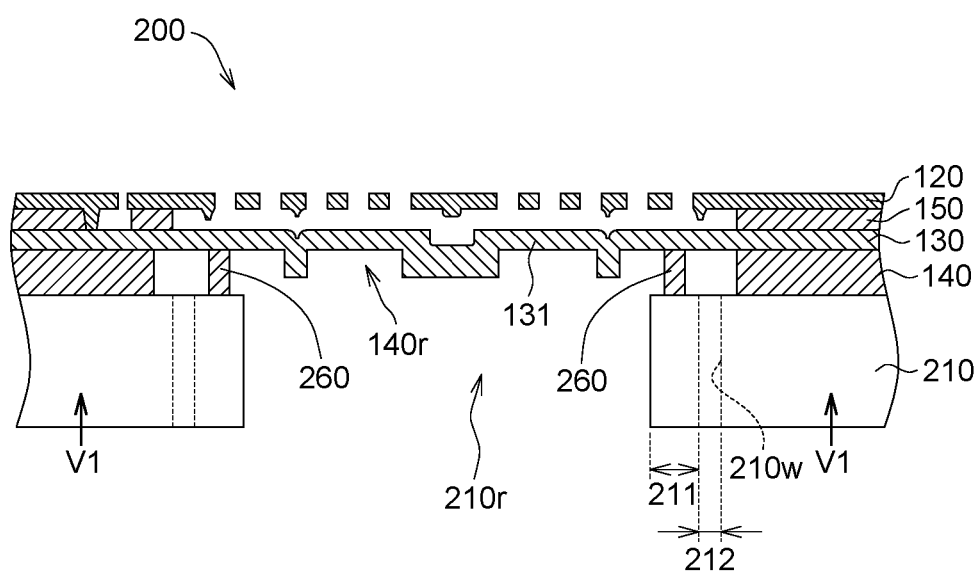
FIG. 3B shows a schematic diagram of a partial cross-sectional view of the MEMS acoustic sensor of FIG. 3A along the direction 3B-3B'.
Figure 3C:
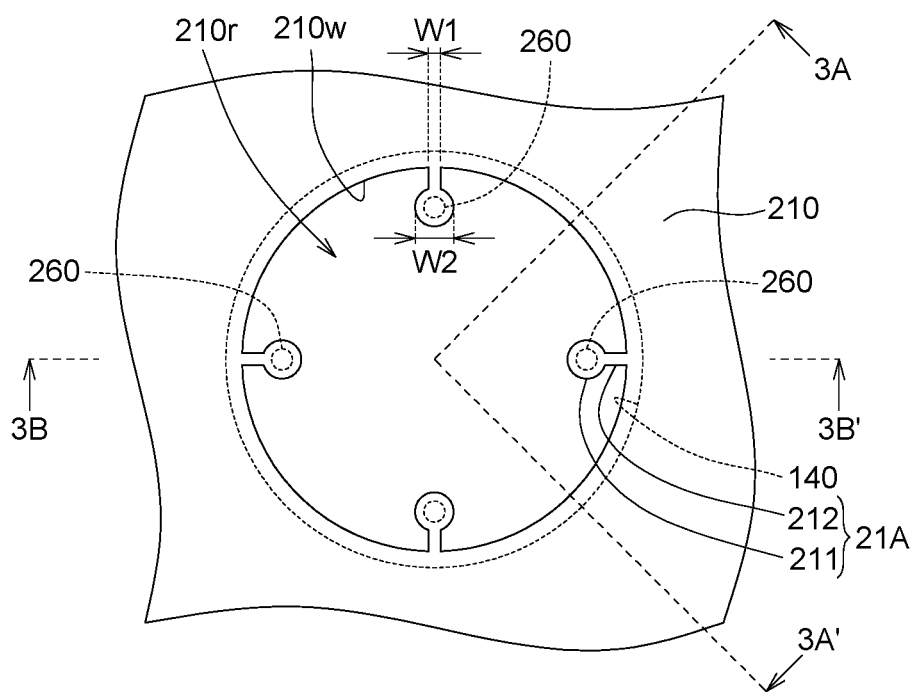
FIG. 3C shows a schematic diagram of a top view of a substrate of the MEMS acoustic sensor of FIG. 3A.

Referring to FIGS. 3A to 3C. FIG. 3A shows a schematic diagram of a partial cross-sectional view of a MEMS acoustic sensor 200 according to another embodiment of the present invention along directions 3A-3A' (the directions 3A-3A' are shown in FIG. 3C), FIG. 3B shows a schematic diagram of a partial cross-sectional view of the MEMS acoustic sensor 200 of FIG. 3A along the direction 3B-3B' (the direction 3B-3B' is shown in FIG. 3C), and FIG. 3C shows a schematic diagram of a top view of a substrate 210 of the MEMS acoustic sensor 200 of FIG. 3A (the dielectric layer 140 is shown in FIG. 3C with a dashed line).

The MEMS acoustic sensor 200 could be applied to vibration detectors, microphones, voice receiving device, etc., for example. The MEMS acoustic sensor 200 or the MEMS packaging structure using the same could be disposed on items that could performs vibration analysis based on received vibrations (for example, generated by audio, vibration), such as earphones, automobiles, wheels, home appliances, industrial instruments, etc.

The MEMS acoustic sensor 200 includes a substrate 210, the back plate 120, the diaphragm 130, the dielectric layers 140 and 150, at least one connecting portion 260 and the electrode layer 170. The MEMS acoustic sensor 200 has technical features similar to or the same as that of the aforementioned MEMS acoustic sensor 100, except that the structure of the substrate 210 of the MEMS acoustic sensor 200 is different from the structure of the substrate 110.

The diaphragm 130 is disposed between the substrate 210 and the back plate 120 and includes the vibrating portion 131. The dielectric layer 140 is formed between the substrate 210 and the diaphragm 130 and has the first cavity 140r corresponding to the vibration portion 131. The connecting portion 260 is located within the first cavity 140r and connects the vibrating portion 131 with the substrate 210. As a result, the external signal source V1 could be transmitted to the diaphragm 130 through the connecting portion, so that the diaphragm 130 vibrates up and down.

As shown in FIG. 3A, the substrate 210 has a second cavity 210r and includes at least one carrier portion 211 and at least one protrusion 212. The second cavity 210r corresponds to the first cavity 140r in position, and the carrier portion 211 extends toward a center of the second cavity 210r relative to a sidewall 210w of the second cavity 210r. As shown in FIG. 3B, the connecting portion 260 is located between the vibrating portion 131 and the supporting portion 211 of the substrate 210, and connects the vibrating portion 131 with the supporting portion 211. In the present embodiment, the connecting portion 260 is a solid column which is located at an edge area of the vibrating portion 131 of the diaphragm 130. In addition, the connecting portion 260 is, for example, a portion of the dielectric layer 140, and the connecting portion 260 and the dielectric layer 140 could be in the same layer structure (or, an integrally formed structure).

Each protrusion 212 connects the corresponding carrier portion 211 and the sidewall 210w. In the present embodiment, the protrusion 212 has a width W1 smaller than a width W2 of the carrier portion 211. In addition, the connected protrusion 212 and carrier portion 211 constitute a carrier group 21A. The embodiment of the present invention takes four carrier groups 21A as an example, but it also could be less than four groups or more than four groups. In addition, the plurality of the carrier group 21A could be evenly distributed relative to a center of the second cavity 210r. For example, an angle between two adjacent carrier groups 21A relative to the center of the second cavity 210r and an angle between another two adjacent carrier groups 21A relative to the center of the second cavity 210r are substantially equal.

Figure 4:
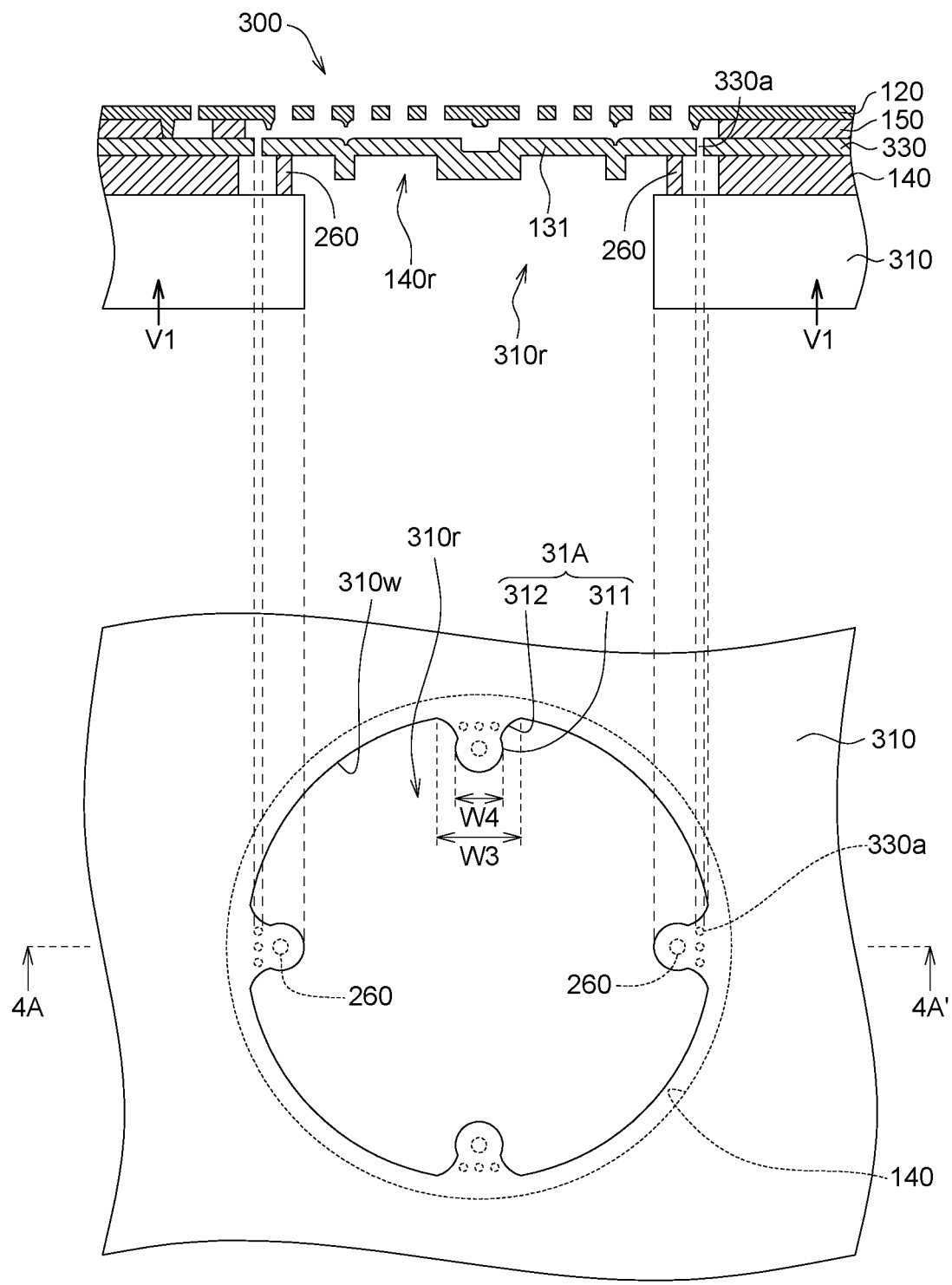
FIG. 4 shows a schematic diagram of a MEMS acoustic sensor according to another embodiment of the present invention.

Referring to FIG. 4, FIG. 4 shows a schematic diagram of a MEMS acoustic sensor 300 according to another embodiment of the present invention, wherein the upper part of FIG. 4 shows a partial cross-sectional view of the MEMS acoustic sensor 300 along direction 4A-4A' (the directions 4A-4A' are shown at the bottom of FIG. 4), and the bottom of FIG. 4 shows a top view of the substrate 310 of the MEMS acoustic sensor 300 (the channel 330a of the diaphragm 330 and the electrical layer 140 are shown in dashed lines).

The MEMS acoustic sensor 300 could be applied to vibration detectors, microphones, voice receiving device, etc., for example. The MEMS acoustic sensor 300 or the MEMS packaging structure using the same could be disposed on items that could performs vibration analysis based on received vibrations (for example, generated by audio, vibration), such as earphones, automobiles, wheels, home appliances, industrial instruments, etc.

The MEMS acoustic sensor 300 includes a substrate 310, the back plate 120, a diaphragm 330, the dielectric layers 140 and 150 and at least one connecting portion 260. The diaphragm 330 is disposed between the substrate 310 and the back plate 120 and includes the vibration portion 131. The dielectric layer 140 is formed between the substrate 310 and the diaphragm 330 and has the first cavity 140r corresponding to the vibration portion 131. The connecting portion 260 is located within the first cavity 140r and connects the vibrating portion 131 with the substrate 310. As a result, the external signal source V1 could be transmitted to the diaphragm 130 through the connecting portion to make the diaphragm 130 vibrate up and down.

The MEMS acoustic sensor 300 has technical features similar to or the same as that the aforementioned MEMS acoustic sensor 200, except that the substrate 310 of the MEMS acoustic sensor 300 has the structure different from that of the substrate 210.

As shown in FIG. 4, the substrate 310 has a second cavity 310r and includes at least one carrier portion 311 and at least one protrusion 312. The second cavity 310r corresponds to the first cavity 140r in position, and the supporting portion 311 extends toward a center of the second cavity 310r relative to a sidewall 310w of the second cavity 310r. The connecting portion 260 is located between the vibrating portion 131 and the carrier portion 311 of the substrate 310. In the present embodiment, as shown in FIG. 4, the connecting portion 260 is a solid column which is located at an edge area of the vibrating portion 131 of the diaphragm 330.

As shown in FIG. 4, the protrusion 312 protrudes relative to the sidewall 310w and connects the supporting portion 311 with the sidewall 310w. The protrusion 312 has a width W3 greater than a width W4 of the carrier portion 311. In addition, the diaphragm 330 has at least one channel 330a. The channel 330a corresponds to the protrusion 312 in position and communicates with the first cavity 140r. Thus, during the process of etching the dielectric layer 140, the etching solution could remove the material of the dielectric layer 140 through the channel 330a. In the present embodiment, the top-view shape of the channel 330a is, for example, a circle, but it could also be an ellipse or a polygon. In the present embodiment, each channel 330a is, for example, a single-point design, or could also extend into a linear shape, such as a curve, a straight line or a combination thereof. As long as the desired structure/pattern of the dielectric layer 140 could be obtained, the embodiment of the present invention does not limit the number, size and/or geometric shape of the channels 330a. In addition, the channel 330a could be used as a stiffness adjustment structure (for example, a hollow structure) which could weaken the stiffness, release stress and allow vibration to be easily transmitted to the diaphragm 130.

In addition, the connected protrusion 312 and carrier portion 311 constitute a carrier group 31A. The embodiment of the present invention takes four carrier group 31A as an example, but it could be less than four groups or more than four groups. In addition, the plurality of the carrier group 31A could be evenly distributed relative to a center of the second cavity 310r. For example, an angle of two adjacent carrier groups 31A relative to the center of the second cavity 210r and an angle of another two adjacent carrier group 31A relative to the center of the second cavity 210r are substantially equal.

Figure 5:
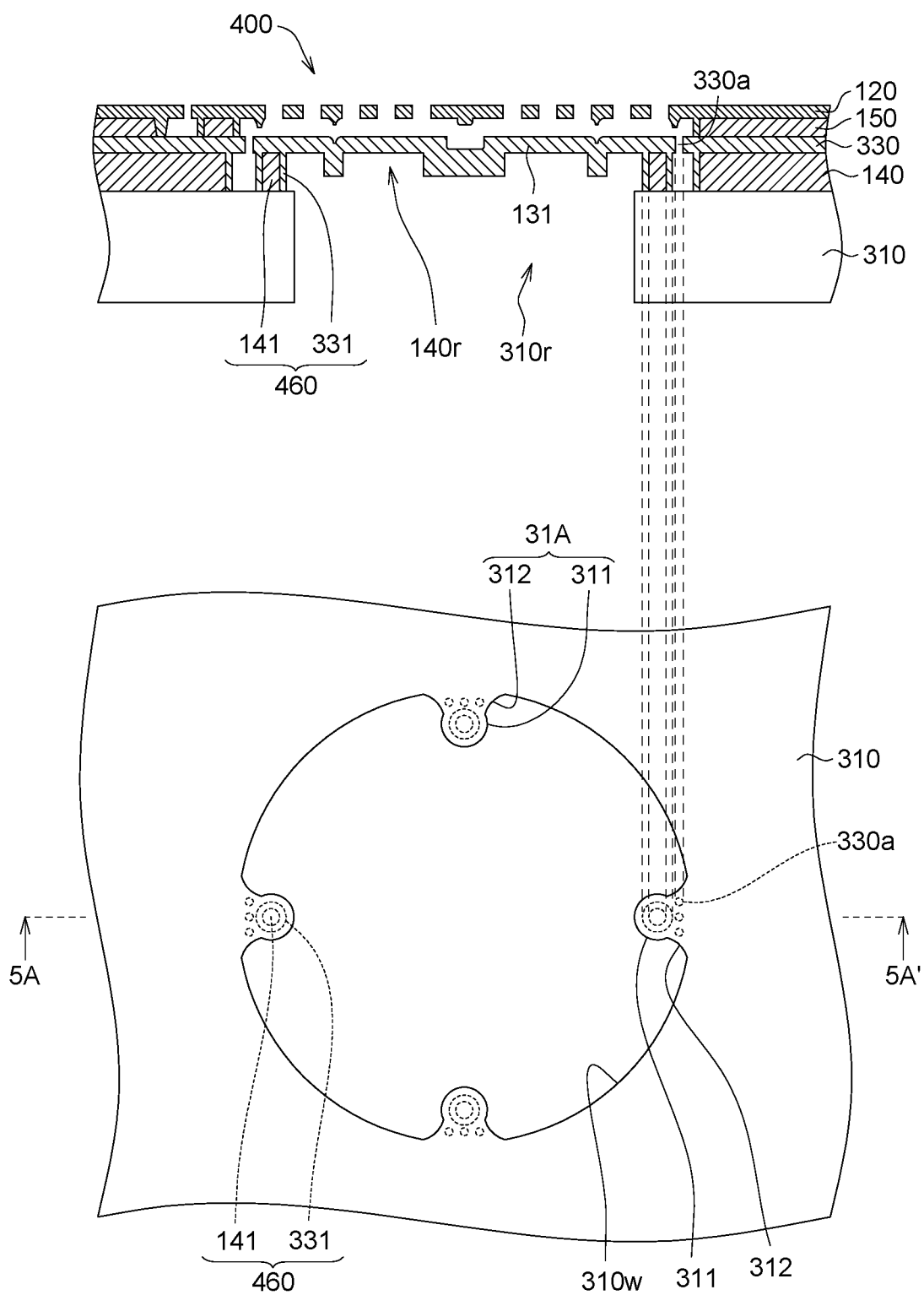
FIG. 5 shows a schematic diagram of a MEMS acoustic sensor according to another embodiment of the present invention.

Referring to FIG. 5, FIG. 5 shows a schematic diagram of a MEMS acoustic sensor 400 according to another embodiment of the present invention, wherein the upper part of FIG. 5 shows a partial cross-sectional view of the MEMS acoustic sensor 400 along direction 5A-5A' (the directions 5A-5A' are shown at the bottom of FIG. 5), and the bottom of FIG. 5 shows a top view of the substrate 310 of the MEMS acoustic sensor 400 (the channel 330a of the diaphragm 330 and the electrical layer 140 are shown in dashed lines).

The MEMS acoustic sensor 400 could be applied to vibration detectors, microphones, voice receiving device, etc., for example. The MEMS acoustic sensor 400 or the MEMS packaging structure using the same could be disposed on items that could performs vibration analysis based on received vibrations (for example, generated by audio, vibration), such as earphones, automobiles, wheels, home appliances, industrial instruments, etc.

The MEMS acoustic sensor 400 includes a substrate 310, the back plate 120, the diaphragm 330, the dielectric layers 140 and 150, and at least one connecting portion 460. The diaphragm 330 is disposed between the substrate 310 and the back plate 120 and includes the vibration portion 131. The dielectric layer 140 is formed between the substrate 310 and the diaphragm 330 and has the first cavity 140r corresponding to the vibration portion 131. The connecting portion 460 is located within the first cavity 140r and connects the vibrating portion 131 with the substrate 310. As a result, the external signal source V1 could be transmitted to the diaphragm 330 through the connecting portion to make the diaphragm 330 vibrate up and down.

The MEMS acoustic sensor 400 has technical features similar to or the same as that of the aforementioned MEMS acoustic sensor 300, expect for the connection portion of the connecting portion 460 has the structure different from that of the connecting portion 260 of the MEMS acoustic sensor 400.

As shown in FIG. 5, the substrate 310 has a second cavity 310r and includes at least one carrier portion 311 and at least one protrusion 312. The second cavity 310r corresponds to the first cavity 140r in position, and the carrier portion 311 extends toward a center of the second cavity 310r relative to the sidewall 310w of the second cavity 310r. As shown in FIG. 5, the connecting portion 460 is located between the vibrating portion 131 and the carrier portion 311 of the substrate 310 and connects the vibrating portion 131 with the substrate 310. In the present embodiment, the connecting portion 460 is a multilayer solid column which is located at an edge area of the vibration portion 131 of the diaphragm 330. The connecting portion 460 includes a covering portion 331 and a supporting portion 141, wherein the covering portion 331 covers a peripheral surface of the supporting portion 141. In terms of material, the connecting portion 460 is composed of a portion of the dielectric layer 140 and a portion of the diaphragm 330. For example, the covering portion 331 is a portion of the diaphragm 330, and the covering portion 331 and the diaphragm 330 could be in the same layer structure (or, an integrally formed structure), while the supporting portion 141 is a portion of the dielectric layer 140, and the supporting portion 141 is a portion of the dielectric layer 140, which could be in the same layer structure (or, an integrally formed structure). The covering portion 331 could determine the position of the supporting portion 141 for obtaining a more precise stiffness of the diaphragm 330.

In addition, as shown in FIG. 5, the connected protrusion 312 and carrier portion 311 constitute a carrier group 31A. The embodiment of the present invention takes four carrier groups 31A as an example, but it could be less than four groups or more than four groups. In addition, the plurality of the carrier groups 31A could be evenly distributed relative to the center of the second cavity 310r. For example, an angle of two adjacent carrier groups 31A relative to the center of the second cavity 210r and an angle of another two adjacent carrier groups 31A relative to the center of the second cavity 210r are substantially equal.

Figure 6:
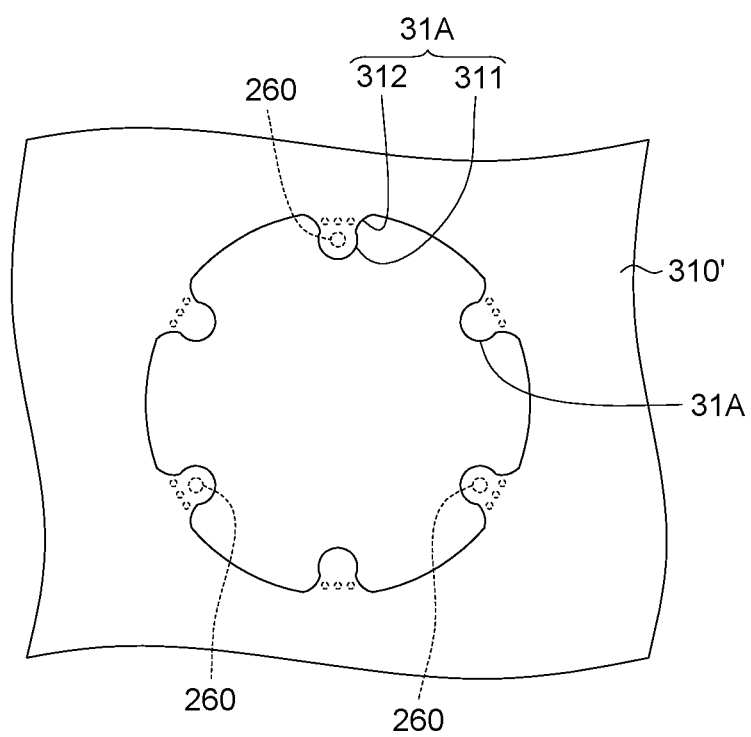
FIG. 6 shows a top view of a substrate 310' of a MEMS acoustic sensor according to another embodiment of the present invention.

Referring to FIG. 6, FIG. 6 shows a top view of a substrate 310' of a MEMS acoustic sensor 400 according to another embodiment of the present invention. The substrate 310' has the features similar to or the same as that of the aforementioned substrate 310, except that the substrate 310' of this embodiment includes a plurality of the carrier groups 31A, wherein not all of the carrier groups are connected to the connecting portion 260. For example, the number of the carrier groups 31A of the present embodiment is, for example, six, wherein three carrier groups 31A are respectively connected to three connecting portions 260, and the other three carrier groups 31A are not connected to the connecting portion 260.

Figure 7A:
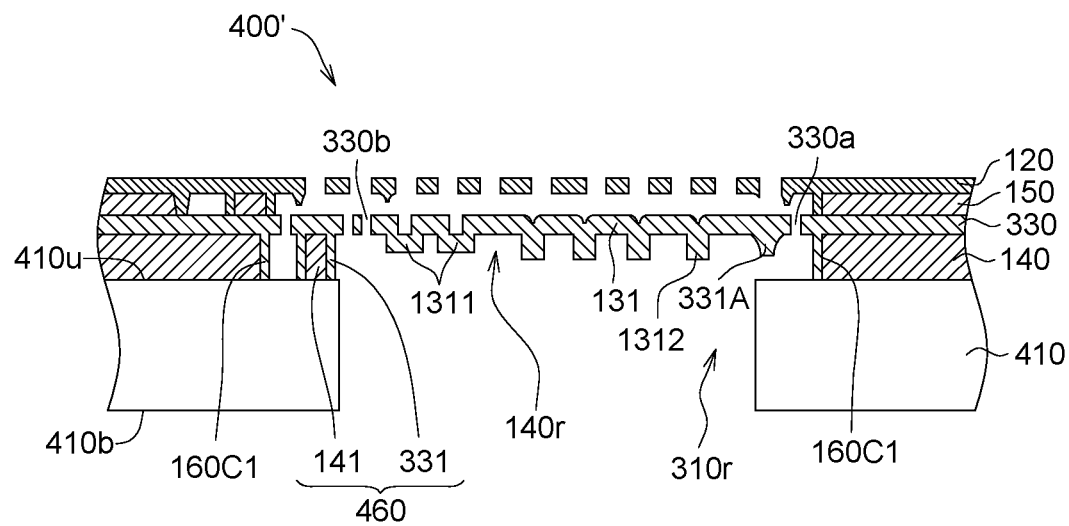
FIG. 7A shows a partial cross-sectional view of a schematic diagram of a MEMS acoustic sensor according to another embodiment of the present invention along direction 7A-7A'.
Figure 7B:
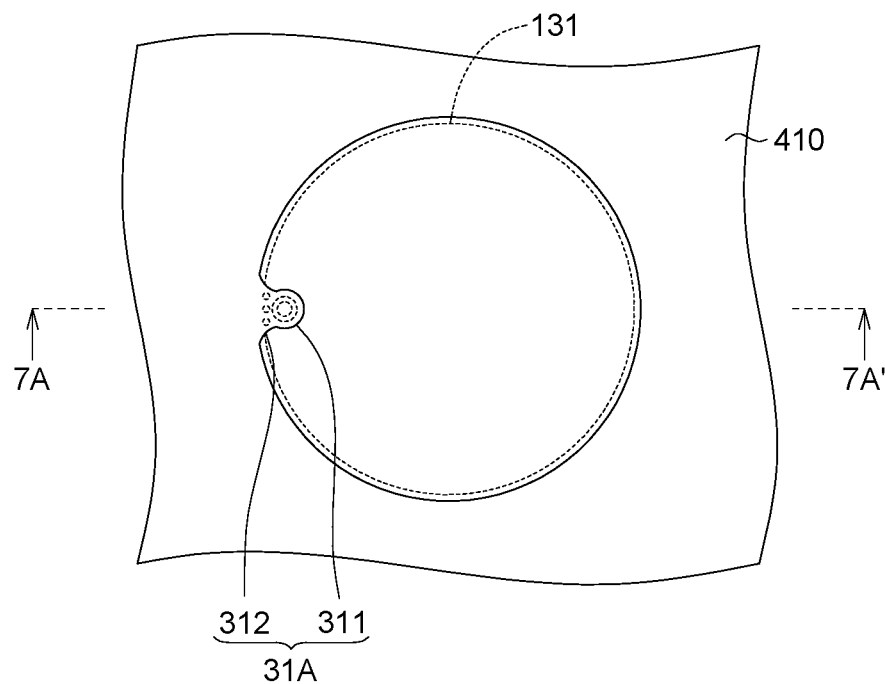
FIG. 7B is a top view of the substrate 410 of the MEMS acoustic sensor of FIG. 7A.

Referring to FIGS. 7A to 7B. FIG. 7A shows a partial cross-sectional view of a schematic diagram of a MEMS acoustic sensor 400' according to another embodiment of the present invention along direction 7A-7A' (the directions 7A-7A' are shown in FIG. 7B), and FIG. 7B is a top view of the substrate 410 of the MEMS acoustic sensor 400' of FIG.

7A (the vibrating portion 131 of the diaphragm 130 are shown in FIG. 7B with a dashed line).

The MEMS acoustic sensor 400' could be applied to vibration detectors, microphones, voice receiving device, etc., for example. The MEMS acoustic sensor 400' or the MEMS packaging structure using the same could be disposed on items that could performs vibration analysis based on received vibrations (for example, generated by audio, vibration), such as earphones, automobiles, wheels, home appliances, industrial instruments, etc.

The MEMS acoustic sensor 400' includes a substrate 410, the back plate 120, the diaphragm 330, the dielectric layers 140 and 150, at least one connection portion (e.g., 460) and the electrode layer 170. The diaphragm 330 is disposed between the substrate 410 and the back plate 120 and includes the vibration portion 131. The dielectric layer 140 is formed between the substrate 410 and the diaphragm 330 and has the first cavity 140r corresponding to the vibration portion 131. The connecting portion 460 is located within the first cavity 140r and connects the vibrating portion 131 with the substrate 410. As a result, the external signal source V1 could be transmitted to the diaphragm 330 through the connecting portion, so that the diaphragm 330 vibrates up and down.

The substrate 410 of the present embodiment has features similar to or the same as that of the aforementioned substrate 310, except that the substrate 410 includes only one carrier group 31A, and one of the connecting portions 460 connects the carrier group 31A with the vibrating portion 131. Compared with the aforementioned MEMS acoustic sensor 400, the number of the connecting portion 460 of the present embodiment is only one. Therefore, the connecting portion 460 has a lower constraint on the vibrating portion 131 which enables the diaphragm 330 to more sensitively sense or detect an external signal source.

In another embodiment, the substrate 410 could have at least one opening (similar to the opening 510a described later), which could extend toward the upper surface 410u of the substrate 410 from the lower surface 410b of the substrate 410, for example, it could extend to the upper surface 410u (the opening is a through hole) or does not extend to the upper surface 410u (the opening is a blind hole). Through the at least one opening, the stiffness of the substrate 410 could be adjusted/changed for obtaining the expected characteristics of the MEMS acoustic sensor 400', such as sensitivity at different vibration frequencies and/or increasing the detection bandwidth.

As shown in FIG. 7A, at least one of the channel 330a, the corrugation layer 1311 and the at least one opening 330b of the diaphragm 330 is equivalent to a spring structure which is connected to the connecting portion, so that the external signal source could be easily transmitted to the diaphragm 330, so that the diaphragm 330 could easily sense the change of vibration. The opening 330b is, for example, a through hole or a blind hole. In addition, the diaphragm 330 further includes at least one dimple 331A which could prevent the diaphragm 330/vibration portion 131 from contacting and sticking to the substrate 410.

Figure 8:
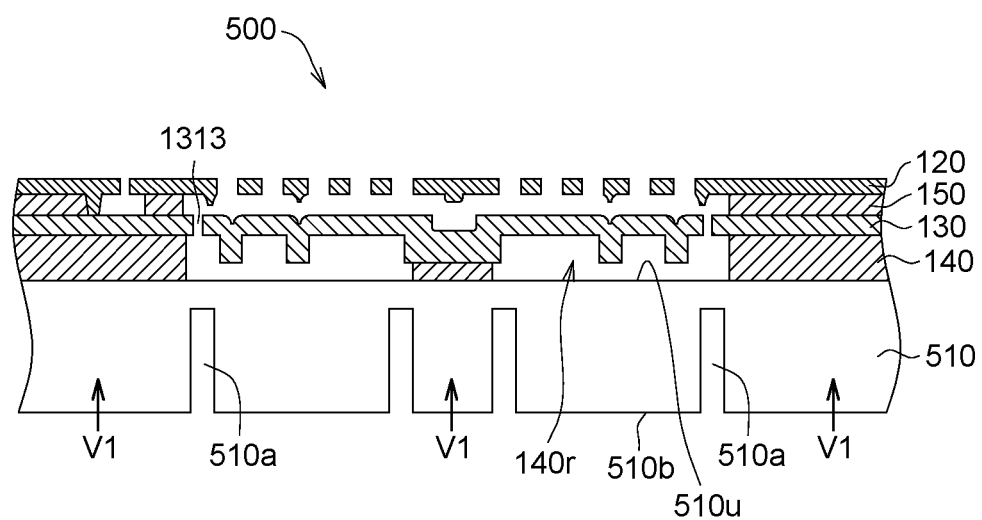
FIG. 8 shows a partial cross-sectional view of a MEMS acoustic sensor according to another embodiment of the present invention.

Referring to FIG. 8, FIG. 8 shows a partial cross-sectional view of a MEMS acoustic sensor 500 according to another embodiment of the present invention.

The MEMS acoustic sensor 500 could be applied to vibration detectors, microphones, voice receiving device, etc., for example. The MEMS acoustic sensor 500 or the MEMS packaging structure using the same could be disposed on items that could performs vibration analysis based on received vibrations (for example, generated by audio, vibration), such as earphones, automobiles, wheels, home appliances, industrial instruments, etc.

The MEMS acoustic sensor 500 includes a substrate 510, the back plate 120, the diaphragm 130, the dielectric layers 140 and 150 and at least one connecting portion. The diaphragm 130 is disposed between the substrate 510 and the back plate 120 and includes the vibration portion 131. The MEMS acoustic sensor 500 of the embodiment of the present invention has the features same as or similar to that of the MEMS acoustic sensor 100, except that the substrate 510 of the MEMS acoustic sensor 500 has the different structure.

As shown in FIG. 8, the substrate 510 has at least one opening 510a. The opening 510a extends toward the upper surface 510u of the substrate 510 from the lower surface 510b of the substrate 510, but does not penetrate the substrate 510. In another embodiment, the opening 510a could penetrate the substrate 510. The opening 510a could adjust/change the stiffness of the substrate 510 for obtaining the expected characteristics of the MEMS acoustic sensor 500, such as sensitivity to different vibration frequencies and/or increasing the detection bandwidth. In addition, the longer the openings 510a and/or the more the number of the openings 510a is, the lower the stiffness of the substrate 510 is; on the contrary, the shorter the openings 510a and/or the less the number of the openings 510a is, the greater the stiffness of the substrate 510 is. The embodiment of the present invention does not limit the number of the openings 510a, for example, it could be four, less or more than four.

In the present embodiment, at least one opening 510a could be formed in the protrusion 112 or other suitable position of the substrate 110 of FIG. 1B. Alternatively, at least one opening 510a could be formed in the protrusion 212 or other suitable position of the substrate 210 of FIG. 3B. Alternatively, at least one opening 510a could be formed in the protrusion 312 or other suitable position of the substrate 310 of FIG. 4. Alternatively, at least one opening 510a could be formed in the protrusion 312 or other suitable position of the substrate 310 of FIG. 5.

Figure 9:
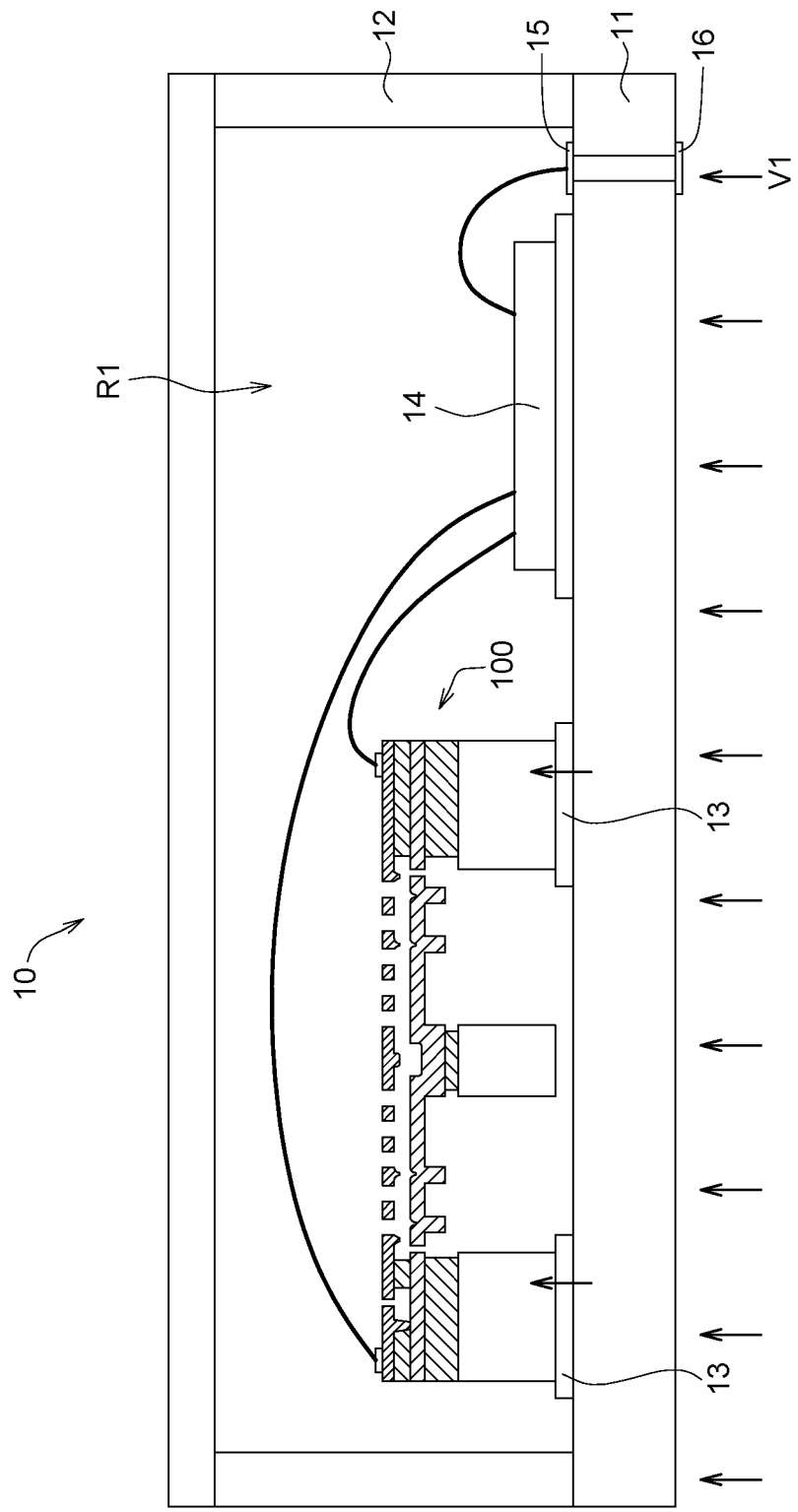
FIG. 9 shows a cross-sectional view of a MEMS package structure according to an embodiment of the present invention.

Referring to FIG. 9, FIG. 9 shows a cross-sectional view of a MEMS package structure 10 according to an embodiment of the present invention. The MEMS package structure 10 could include a MEMS acoustic sensor 100, a carrier plate 11, a housing 12, a pad 13, an integrated circuit die 14, at least one first contact 15 and at least one second contact 16. The carrier plate 11 and the housing 12 could define an accommodating space R1. The MEMS acoustic sensor 100 could be disposed on the pad 13 formed on the carrier plate 11. The pad 13 has insulation and/or thermal conductivity, for example. The integrated circuit die 14 could be disposed on the carrier plate 11. The MEMS acoustic sensor 100 and the integrated circuit die 14 could be connected and electrically connected by bonding wire. In an embodiment, the carrier plate 11 could include a printed circuit board or could itself be a printed circuit board. In an embodiment, the integrated circuit die 14 is, for example, an Application Specific Integrated Circuit (ASIC) chip. In an embodiment, the housing 12 is connected to the carrier plate 11 and covers the MEMS acoustic sensor 100, the carrier plate 11, the pads 13 and the integrated circuit die 14. The carrier plate 11 includes a conductive material, such as metal. In an embodiment, the housing 12 could include a printed circuit board. In an embodiment, the carrier plate 11 is disposed close to the signal source (the direction of the signal source V1 is indicated by the arrow below the carrier plate 11, but the disclosure is not limited to this), and includes solid conductive paths, such as ear bones. In an embodiment, the MEMS packaging structure has an empty portion (without material) which could be filled with gas, such as air, and it is simple to manufacture and low in cost. In another embodiment, the MEMS packaging structure has an empty portion (without material) could be evacuated to reduce damping effect, resulting in lower energy loss or energy loss. In another embodiment, the MEMS acoustic sensor 100 of the MEMS package structure 10 could be replaced by any of the MEMS acoustic sensors 100', 200, 300, 400, 400', and 500.

The first contact 15 is electrically connected with the second contact 16. The second contact 16 is connected to the first contact 15 to provide the integrated circuit die 14 with the driving input signal, and the sensing signal sensed by the MEMS acoustic sensor 100 is processed by the integrated circuit die 14, then is output to the first contact 15, and then is output by the second contact 16.

Referring to FIG. 10, FIG. 10 shows a cross-sectional view of a MEMS package structure 20 according to another embodiment of the present invention. The MEMS packaging structure 20 could include the MEMS acoustic sensor 100, the carrier plate 11, the housing 12, the pad 13, the integrated circuit die 14, at least one first contact 15 and at least one second contact 16 and at least one connecting wire 25. The MEMS packaging structure 20 has the structure the same as or similar to that of the MEMS packaging structure 10, expect that the MEMS acoustic sensor 100 is disposed on the housing 12. For example, the MEMS acoustic sensor 100 is disposed on an upper portion of the housing 12 opposite to the carrier plate 11, or could also be disposed on a lateral portion of the housing 12. In addition, the MEMS packaging structure 20 further includes the connection wire 25 electrically connecting the integrated circuit die 14 and the carrier plate 11. The connecting wire 25 could be formed on, inside or outside the carrier plate 11 and the casing 12 and connects at least one first contact 15 with at least one second contact 16. The connecting wire 25 is, for example, a conductive wire, such as a copper wire, etc., which could be formed on the carrier plate 11 and the housing 12 by printing, for example. In another embodiment, the MEMS acoustic sensor 100 of the MEMS package structure 20 could be replaced by any of the MEMS acoustic sensors 100', 200, 300, 400, 400', and 500.

Figure 11:
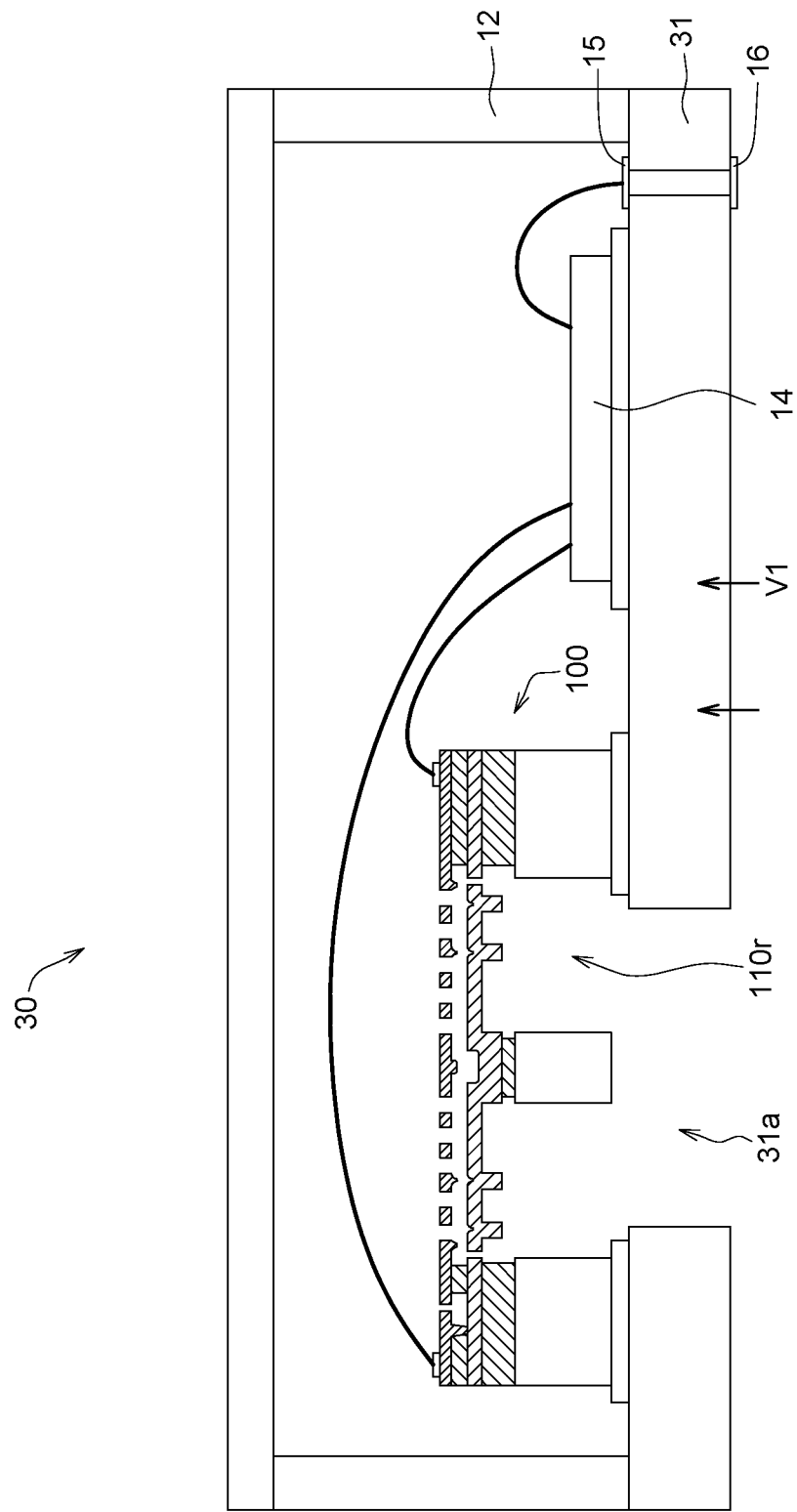
FIG. 11 shows a cross-sectional view of a MEMS package structure according to another embodiment of the present invention.

Referring to FIG. 11, FIG. 11 shows a cross-sectional view of a MEMS package structure 30 according to another embodiment of the present invention. The MEMS package structure 30 could include the MEMS acoustic sensor 100, a carrier plate 31, the housing 12, the pad 13, the integrated circuit die 14, at least one first contact 15 and at least one second contact 16. The MEMS packaging structure 30 has the structure the same as or similar to that of the MEMS packaging structure 10, except that the carrier plate 31 has a through hole 31a. The through hole 31a is located under the second cavity 110r of the substrate 110. The through hole 31a could provide a path for sound signal in the outside air to enter the MEMS packaging structure 30, but the embodiment of the present invention is not limited thereto. In other embodiments, the through hole 31a could be disposed on the housing 12, for example, at least one through hole 31a is formed in the upper portion and/or the lateral portion of the housing 12. In another embodiment, the MEMS acoustic sensor 100 of the MEMS package structure 30 could be replaced by any of the MEMS acoustic sensors 100', 200, 300, 400, 400', and 500.

Figure 12:
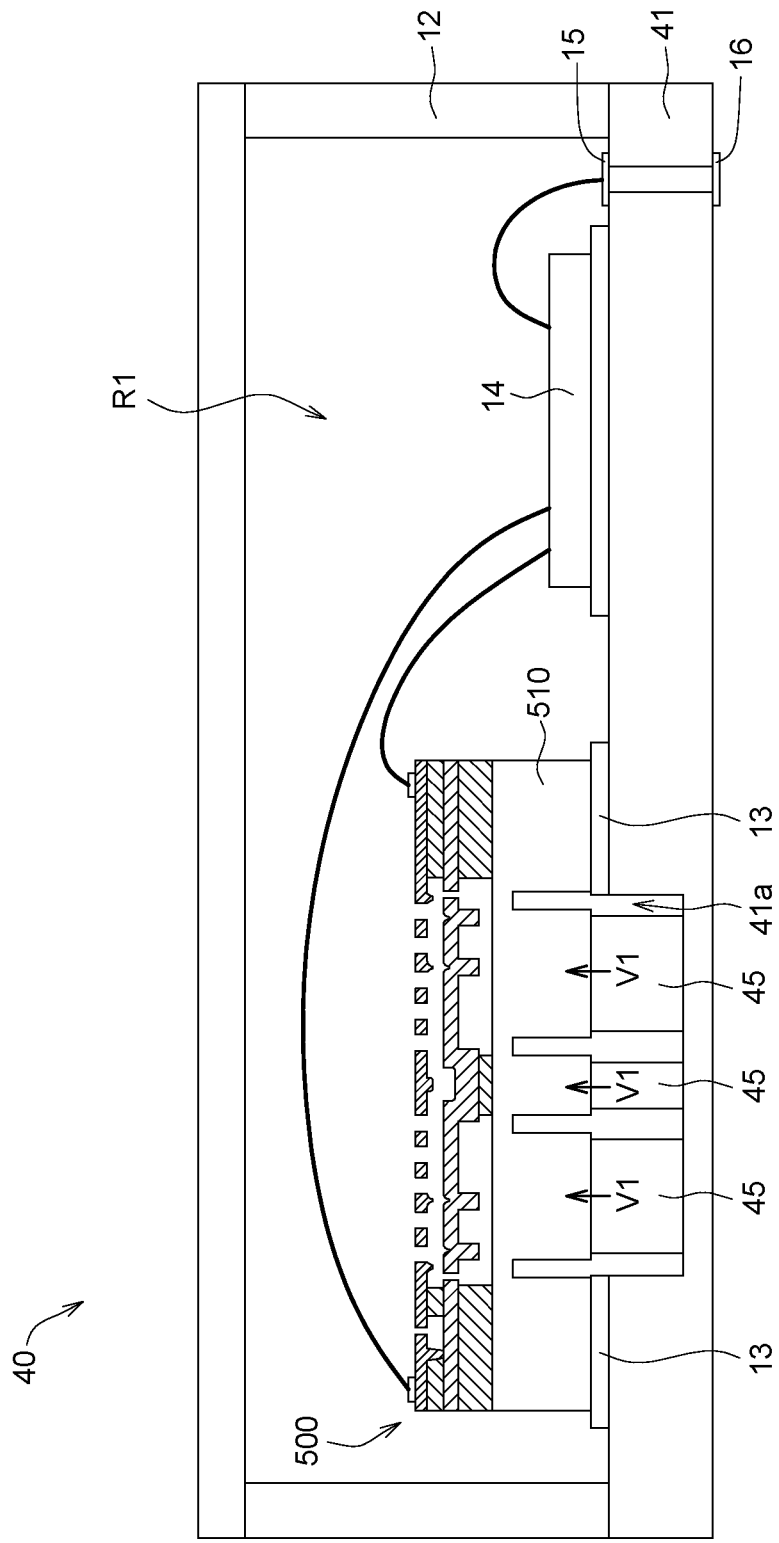
FIG. 12 shows a cross-sectional view of a MEMS package structure according to another embodiment of the present invention.

Referring to FIG. 12, FIG. 12 shows a cross-sectional view of a MEMS package structure 40 according to another embodiment of the present invention. The MEMS package structure 40 could include a MEMS acoustic sensor 500, a carrier plate 41, the housing 12, the pad 13, the integrated circuit die 14, at least one connecting element 45, at least one first contact 15 and at least one second contact 16. The MEMS package structure 40 has the structure the same as or similar to that of the MEMS package structure 10, except that the MEMS acoustic sensor is replaced by the element 500, and the carrier 41 has different structure.

The carrier 41 has an opening 41a. In the present embodiment, the opening 41a is, for example, a blind hole, such as a recess or a groove. The MEMS acoustic sensor 500 is disposed on the carrier plate 41, and a portion of the substrate 510 corresponds to the opening 41a in position. The connecting element 45 is disposed in the opening 41a and connects or contacts the substrate 510 of the MEMS acoustic sensor 500. The external signal source V1 could be transmitted to the MEMS acoustic sensor 500 through the connecting element 45. In another embodiment, the MEMS acoustic sensor 500 of the MEMS packaging structure 40 could be replaced by any one of the MEMS acoustic sensors 100', 100, 200, 300, 400, and 400'.

Figure 13:
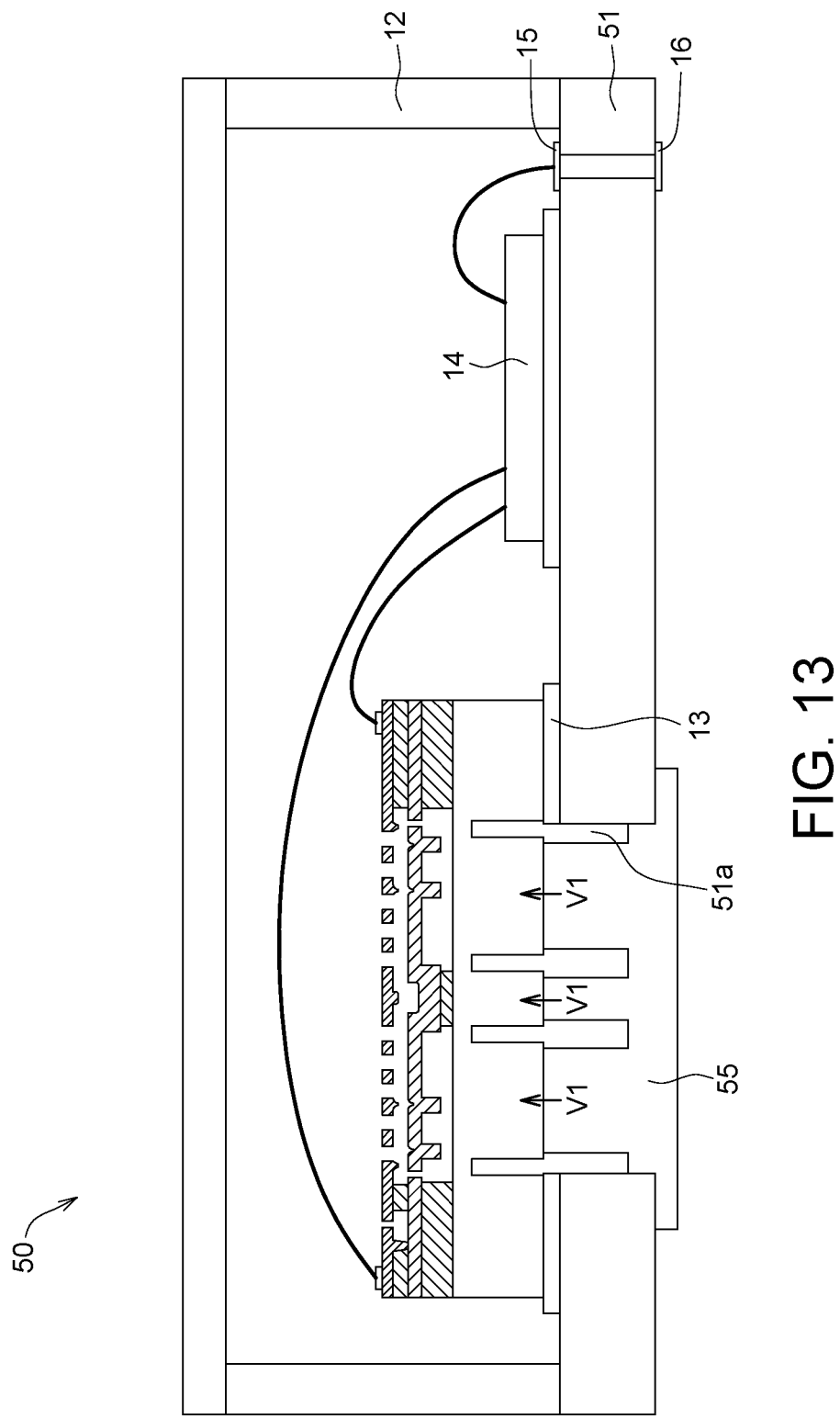
FIG. 13 shows a cross-sectional view of a MEMS package structure according to another embodiment of the present invention.

Referring to FIG. 13, FIG. 13 shows a cross-sectional view of a MEMS package structure 50 according to another embodiment of the present invention. The MEMS package structure 50 could include a MEMS acoustic sensor 500, a carrier plate 51, the housing 12, the pad 13, the integrated circuit die 14, the connecting element 55, at least one first contact 15 and at least one The second contact 16. The MEMS package structure 50 has the structure the same as or similar to that of the MEMS package structure 40, except that the carrier plate 51 has the structure different from that of the carrier plate 41 and the connecting element 55 has the structure different from that of the connecting element 45.

The carrier plate 51 has an opening 51a. In the present embodiment, the opening 51a is, for example, a through hole. The MEMS acoustic sensor 500 is disposed on the carrier plate 51, and a portion of the substrate 510 corresponds to the opening 51a in position. The connecting element 55 is disposed in the opening 51a, and connects or contacts the substrate 510 of the MEMS acoustic sensor 500. The external signal source V1 could be transmitted to the MEMS acoustic sensor 500 through the connecting element 55. In the present embodiment, the connecting element 55 is, for example, a hole plug which could be inserted into the opening 51a of the carrier plate 51 to compact or close the substrate 510 of the MEMS acoustic sensor 500.

In another embodiment, the MEMS acoustic sensor 500 of the MEMS packaging structure 50 could be replaced by any of the MEMS acoustic sensors 100', 100, 200, 300, 400 and 400'.

Figure 14A:
FIGS. 14A to 14P show a method of manufacturing the MEMS acoustic sensor according to an embodiment.
Figure 14B:
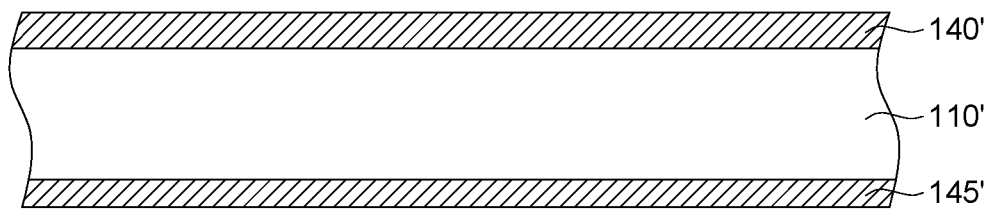
Figure 14C:
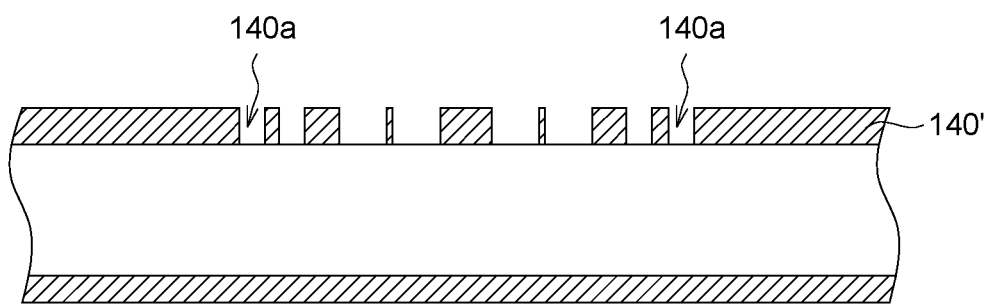
Figure 14D:
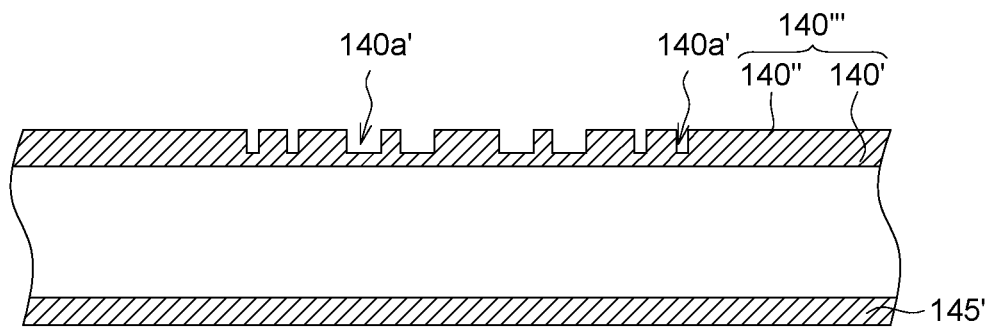
Figure 14E:
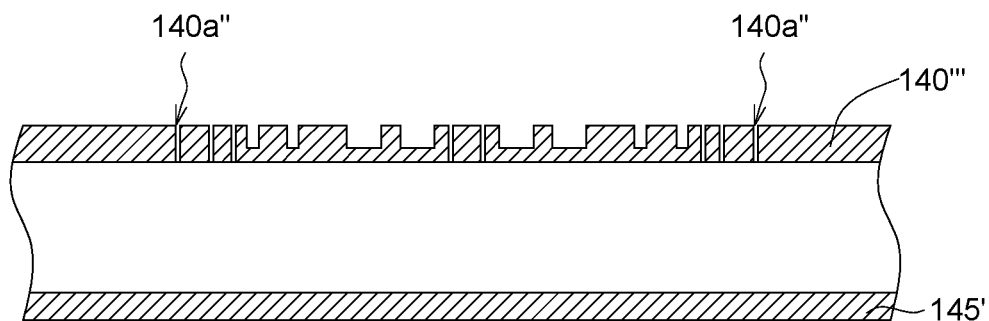
Figure 14F:
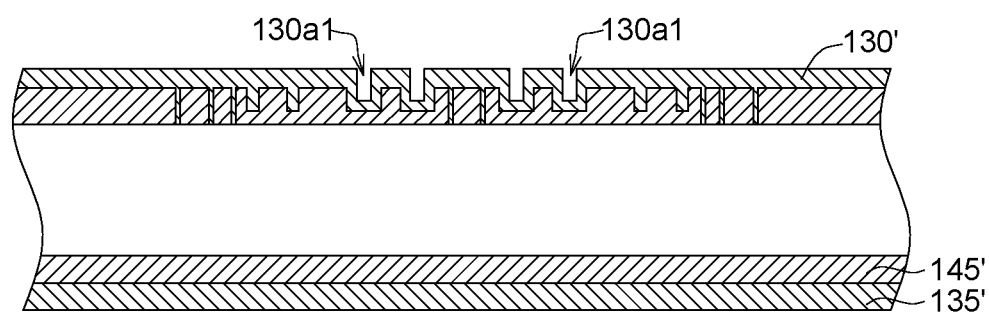
Figure 14G:
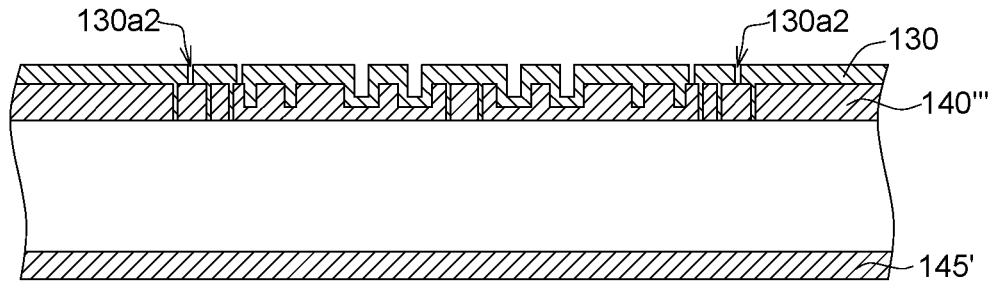
Figure 14H:
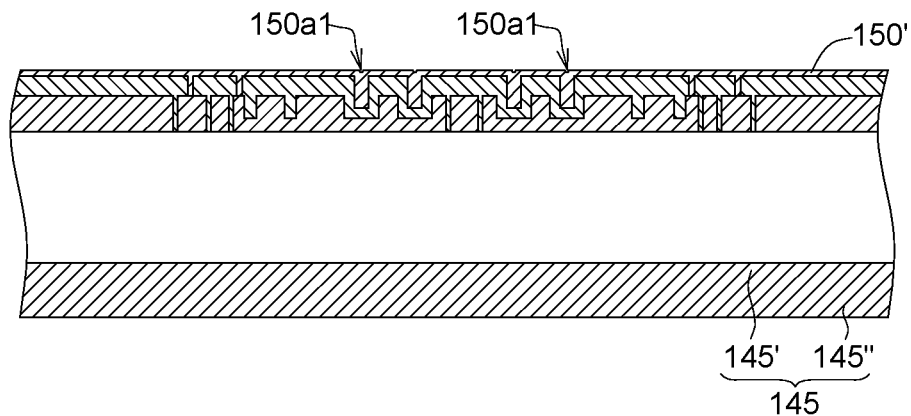
Figure 14I:
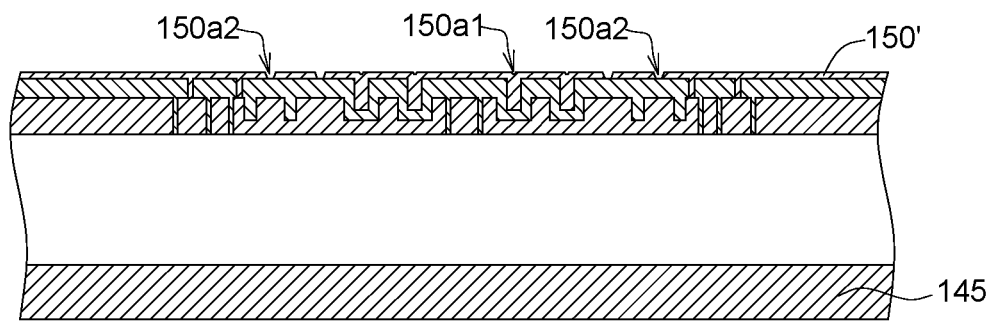
Figure 14J:
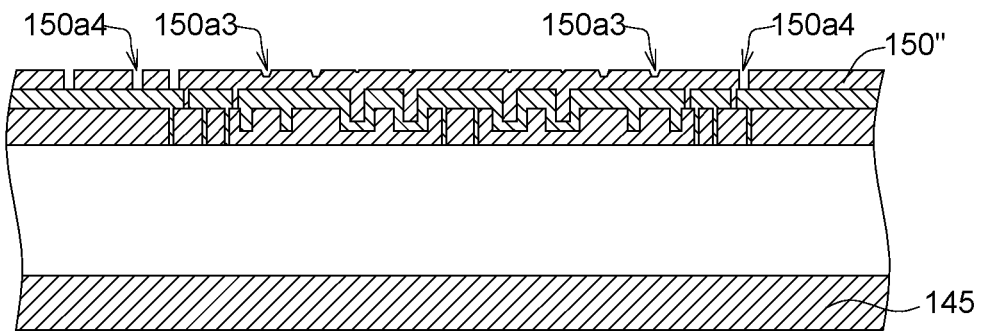
Figure 14K:
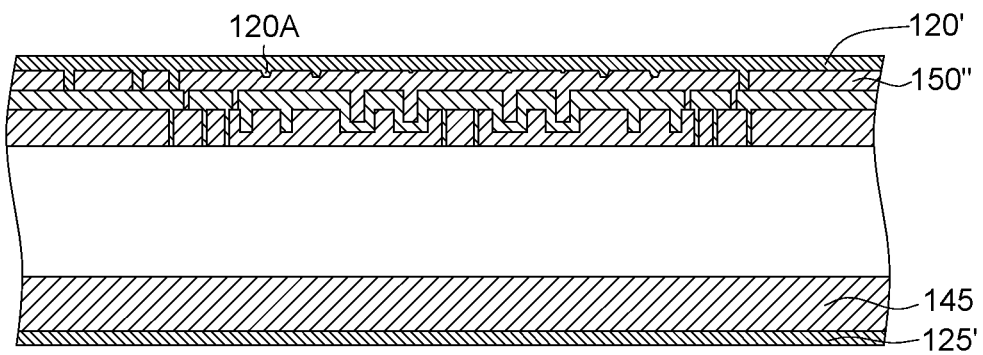
Figure 14L:
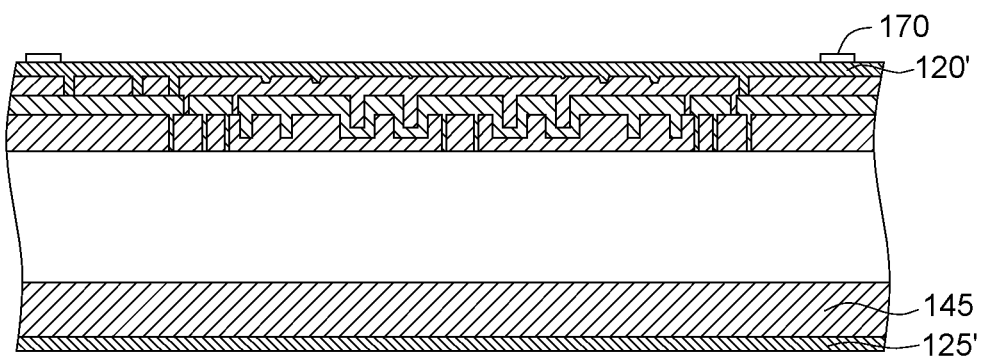
Figure 14M:
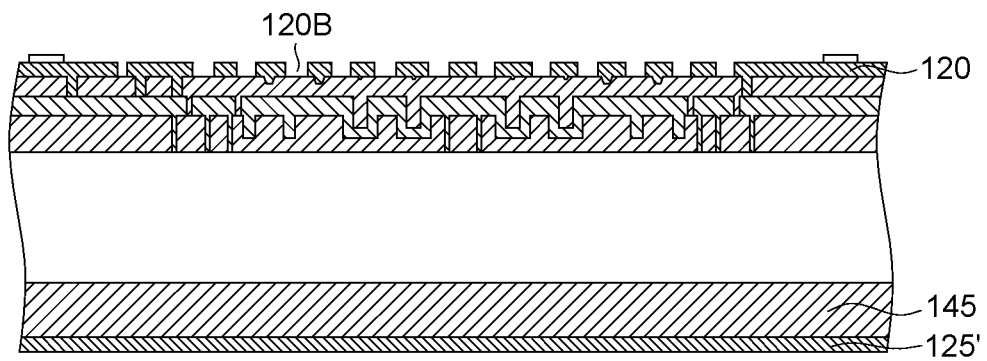
Figure 14N:
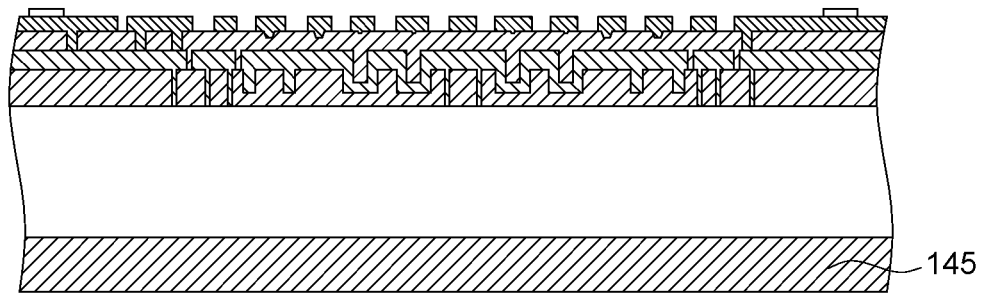
Figure 14O:
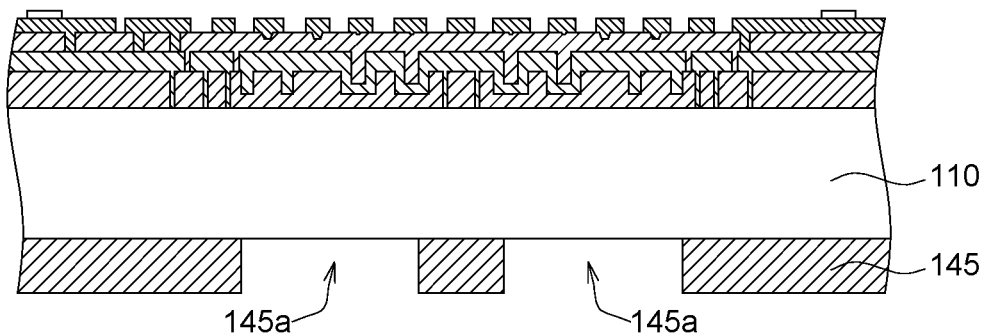
Figure 14P:
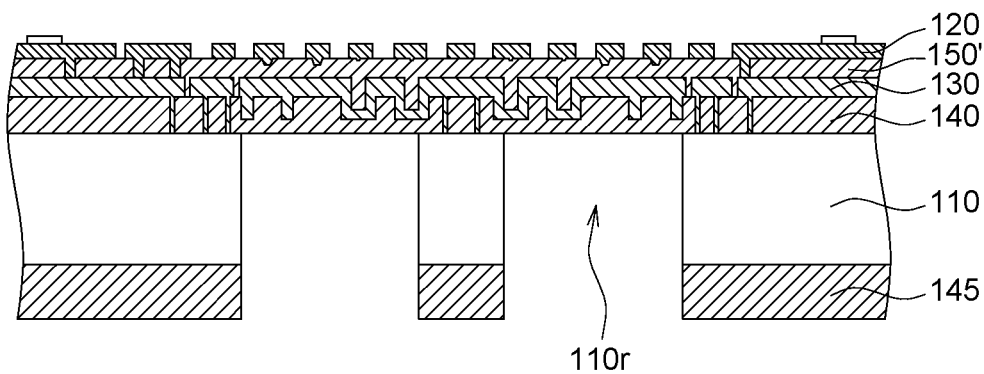

FIGS. 14A to 14P show a method of manufacturing the MEMS acoustic sensor 100 according to an embodiment.

As shown in FIG. 14A, a substrate layer 110' is provided. In an embodiment, the substrate layer 110' is, for example, a silicon substrate. However, the embodiment of the present invention is not limited thereto, and the substrate layer 110' could include other suitable semiconductor materials.

As shown in FIG. 14B, a dielectric material layer 140 and a dielectric material layer 145' are formed on an upper surface (or a front surface) and a lower surface (or a back surface) of the substrate layer 110' respectively by, for example, using a deposition process or a thermal oxidation process. The deposition process, such as plasma-enhanced oxide (PEOX), is not intended to limit the embodiment of the present invention. In an embodiment, the dielectric material layer 140' and the dielectric material layer 145' are formed at the same time/in the same process, for example. In terms of material, the dielectric material layer 140' and/or the dielectric material layer 145' contains oxide, such as silicon oxide, for example. The material of the dielectric material layer 140' and the material of the dielectric material layer 145' could be the same or different.

As shown in FIG. 14C, the dielectric material layer 140' is patterned to form a concave portion pattern which includes at least one concave portion 140a by using photolithography etching process, for example. The "concave portion" herein includes, for example, recess and/or through holes. The "photolithography etching process" herein includes, for example, coating (photoresist), exposure, development and/or etching. The number and/or geometric shapes (patterns) of the "concave portion" could be determined according to actual conditions, and are not limited in the embodiment of the present invention.

As shown in FIG. 14D, a dielectric material layer 140" is formed on the dielectric material layer 140' by using the deposition process, for example, wherein the dielectric material layer 140" and the dielectric material layer 140' are together called the dielectric material layer 140'''. The dielectric material layer 140''' has a concave portion pattern which includes at least one concave portion 140a', and the concave portion 140a' is formed to conform to the shape of the concave portion 140a. In addition, the material of the dielectric material layer 140''' is, for example, oxide, such as silicon oxide, silicon dioxide, oxide, or TEOS oxide, but this is not intended to limit the present invention. In an embodiment, the concave portion 140a' could define the structure of the diaphragm 130 to be formed subsequently, but the embodiment of the present invention is not limited thereto. The material of the dielectric material layer 140" and the material of dielectric material layer 140' could be the same or different.

As shown in FIG. 14E, at least one concave portion 140a" is formed by using, for example, the etching process. The recess 140a" is, for example, a through hole passing through the dielectric material layer 140'''.

As shown in FIG. 14F, the diaphragm layer 130' is formed and the element layer 135' is formed on the dielectric material layer 145' by using, for example, the deposition process. The diaphragm layer 130' has a concave portion pattern which could include at least one concave portion 130a1. The concave portion 130a1 is formed at a position corresponding to the concave portion 140a'. The element layer 135' and the diaphragm layer 130' could be formed at the same time. In addition, the material of the diaphragm layer 130' and the material of the element layer 135' could be the same, for example, polysilicon, silicon carbide (SiC), single crystal and other semiconductor materials. It could make the material have conductive properties by using process, such as ion implantation or doping, but the embodiments of the present invention are not limited thereto.

As shown in FIG. 14G, at least one recess 130a2 is formed on the diaphragm layer 130' of FIG. 14E to form the diaphragm 130 by using, for example, the photolithography etching process. The concave portion 130a2, for example, passes through the diaphragm layer 130' to expose the dielectric material layer 140'''. In this step, the element layer 135' could be removed at the same time to expose the dielectric material layer 145'.

As shown in FIG. 14H, a dielectric material layer 150' is formed on the diaphragm 130 and a dielectric material layer 145" is formed on the dielectric material layer 145' by using, for example, the deposition process, wherein the dielectric material layer 150' fills the concave portion 130a2. The dielectric material layer 150' could have a concave portion pattern which includes at least one concave portion 150a1.

The concave portion 150a1 is formed corresponding to the concave portion 130a1 of the diaphragm 130. The dielectric material layer 145" and the dielectric material layer 145' are together referred to as the dielectric material layer 145. In an embodiment, the dielectric material layer 150' and the dielectric material layer 145' are formed at the same time, for example. In addition, the materials of the dielectric material layer 150' and the materials of the dielectric material layer 145" could be the same, for example, oxide, such as silicon oxide, but the embodiment of the present invention is not limited thereto.

As shown in FIG. 14I, at least one concave portion 150a2 is formed on the dielectric material layer 150' to form a dimple for reducing the surface viscosity by using, for example, the photolithography etching process.

As shown in FIG. 14J, a dielectric material layer 150" is formed on the dielectric material layer 150' of FIG. 14I by using, for example, the deposition process to fill the concave portion 150a2. The dielectric material layer 150" has at least one concave portion 150a3 and at least one concave portion 150a4, wherein the concave portion 150a4 exposes the diaphragm 130. In an embodiment, the material of the dielectric material layer 150" is, for example, oxide, such as silicon oxide, but the embodiment of the present invention is not limited thereto. The concave portion 150a3 and the concave portion 150a4 could be formed by using the lithography process and the etching process.

As shown in FIG. 14K, a back plate material 120' is formed on the dielectric material layer 150" and an element layer 125' is formed on the dielectric material layer 145 by using, for example, the deposition process, wherein the back plate material 120' fills the concave portion 150a4 to be electrically connected to the diaphragm 130. The back plate material 120' includes at least one dimple 120A which is formed corresponding to the concave portion 150a3. In addition, the back plate material 120' and the element layer 125' could be formed at the same time. In addition, the back plate material 120' and the element layer 125' could be the same material, for example, semiconductor materials, such as polysilicon, silicon carbide (SiC) and other semiconductor materials. It could make the material have conductive properties by using process, such as ion implantation or doping, but the embodiments of the present invention are not limited thereto.

As shown in FIG. 14L, an electrode layer 170 is formed on the back plate material 120' by using, for example, a metal deposition process, the photolithography etching process, an etching process or a lift-off process, etc., wherein the electrode layer 170 could include two electrodes, one of which is the positive electrode for the diaphragm, and the other is the negative electrode for the back plate.

As shown in FIG. 14M, the back plate material 120' is patterned to form the back plate 120 by using, for example, the photolithography etching process. The back plate 120 has at least one acoustic hole 120B.

As shown in FIG. 14N, the element layer 125' is removed by using, for example, the etching process, to expose the dielectric material layer 145.

As shown in FIG. 14O, the dielectric material layer 145 is patterned to form at least one concave portion 145a by using, for example, the photolithography etching process, wherein the concave portion 145a exposes the substrate layer 110'.

As shown in FIG. 14P, for example, a portion of the material of the substrate layer 110' is removed to form the substrate 110 by using, for example, the etching process, wherein the substrate 110 has at least one second cavity 110r.

Then, the dielectric material is removed by etching solution passing through the concave portion 145a and the second cavity 110r of FIG. 14P to form the dielectric layer 140 and the dielectric layer 150 of FIG. 1A by using, for example, a wet etching process.

The manufacturing methods of the MEMS acoustic sensors 100', 200, 300, 400' and 400 are similar or the same as the manufacturing method of the MEMS acoustic sensor 100, except that the back plate, the diaphragm, the dielectric layer and/or substrate having different structures could be formed by using masks having different patterns.

Figure 15A:
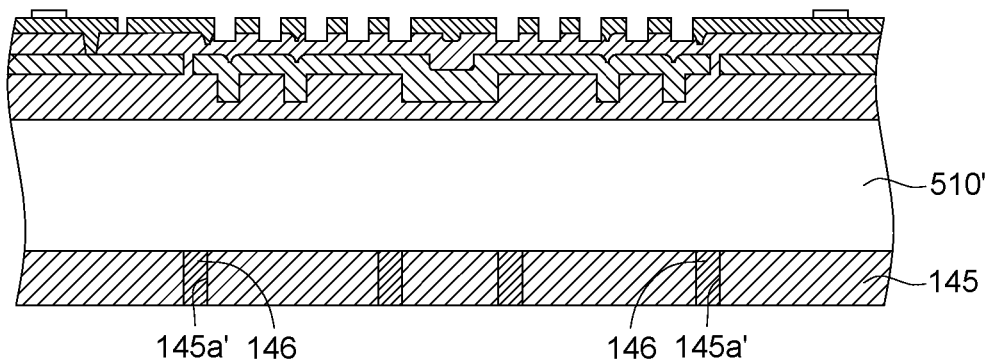
FIGS. 15A to 15B show the manufacturing process of the MEMS acoustic sensor of FIG. 8.
Figure 15B:
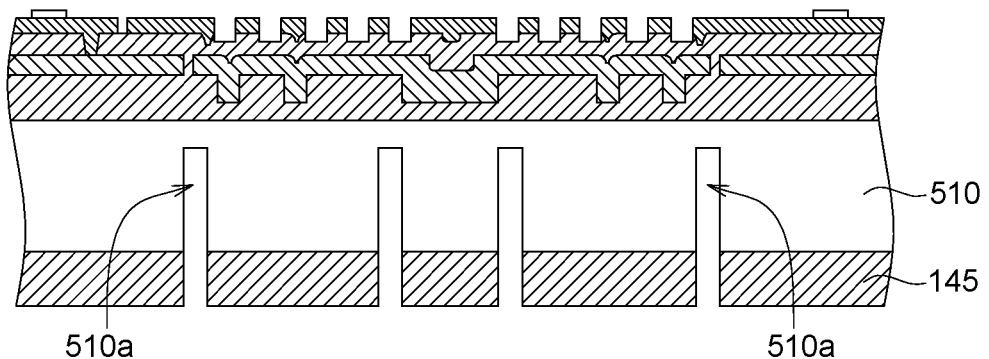

Referring to FIGS. 15A to 15B, FIGS. 15A to 15B show the manufacturing process of the MEMS acoustic sensor 500 of FIG. 8. The manufacturing process of the MEMS acoustic sensor 500 is similar or the same as that of the MEMS acoustic sensor 100, expect that the manufacturing process of the substrate 510.

As shown in FIG. 15A, at least one photoresist 146 is formed on at least one opening 145a' of the dielectric material layer 145 by using, for example, the photolithography etching process, wherein the opening 145a' exposes the substrate layer 510', and the photoresist 146 fills the opening 145a'.

As shown in FIG. 15B, the photoresist 146 and the substrate material corresponding to the photoresist 146 are removed, by using etching process, to form at least one opening 510a in the substrate layer 510' to form the substrate 510.

The manufacturing steps of the MEMS acoustic sensor 500 are the same or similar to the corresponding manufacturing steps of the MEMS acoustic sensor 100, and the similarities will not be repeated here.

Taking the manufacturing method of the MEMS package structure 10 as an example, the integrated circuit die 14 and the MEMS acoustic sensor (for example, one of the labels 100, 100', 200, 300, 400, 400' and 500) are disposed on the carrier plate 11, then the carrier plate 11, the integrated circuit die 14 and the MEMS acoustic sensor are electrically connected by solder wire by using, for example, wire bonding, and then the housing 12 is disposed on the carrier plate 11 to cover the integrated circuit die 14 and the MEMS acoustic sensor. The manufacturing process of the other MEMS packaging structures 20, 30, 40 and 50 is similar to that of the MEMS packaging structure 10, and the similarities will not be repeated here.

While the invention has been described by way of example and in terms of the preferred embodiment (s), it is to be understood that the invention is not limited thereto. On the contrary, it is intended to cover various modifications and similar arrangements and procedures and the scope of the appended claims therefore should be accorded the broadest interpretation so as to encompass all such modifications and similar arrangements and procedures.

What is claimed is:

1. A micro-electro-mechanical system (MEMS) acoustic sensor, comprising:
    a substrate;
    a back plate,
    a diaphragm disposed between the substrate and the back plate and comprising a vibrating portion;
    a dielectric layer formed between the substrate and the diaphragm and having a first cavity corresponding to the vibrating portion; and
    a connecting portion disposed within the first cavity and connecting the vibrating portion with the substrate;
    wherein the substrate has a second cavity and comprises a carrier portion, and second cavity corresponds to the first cavity in position, the carrier portion protrudes relative to a sidewall of the second cavity, and the connecting portion is located between the vibrating portion and the substrate;
    wherein the substrate further comprises a protrusion extending from the sidewall toward the supporting portion and connected to the supporting portion; a width of the protrusion is greater than a width of the carrier portion.

2. The MEMS acoustic sensor according to claim 1, wherein the connecting portion is a column.

3. The MEMS acoustic sensor according to claim 1, wherein the connecting portion is located in a middle area of the vibrating portion.

4. The MEMS acoustic sensor according to claim 1, wherein the connecting portion is located at an edge area of the vibrating portion.

5. The MEMS acoustic sensor according to claim 1, wherein the vibrating portion has a spring structure connected to the connecting portion.

6. The MEMS acoustic sensor according to claim 1, wherein the substrate has an opening formed in the protrusion.

7. The MEMS acoustic sensor according to claim 1, wherein the diaphragm has a channel, and the channel corresponds to the protrusion in position.

8. The MEMS acoustic sensor according to claim 1, wherein the diaphragm has a channel communicated with the first cavity.

9. The MEMS acoustic sensor according to claim 1, wherein the connecting portion comprises:
    a supporting portion; and
    a covering portion covering the supporting portion.

10. The MEMS acoustic sensor according to claim 9, the covering portion is made of a material the same as that of the diaphragm.

11. The MEMS acoustic sensor according to claim 1, wherein the connecting portion is made of a material the same as that of the dielectric layer.

12. The MEMS acoustic sensor according to claim 1, wherein the substrate has a lower surface and an opening, and the opening upward extends from the lower surface of the substrate.

13. The MEMS acoustic sensor according to claim 1, wherein the vibrating portion has a protruding structure and/or a hollow structure.

14. A MEMS package structure, comprising:
    a carrier plate; and
    the MEMS acoustic sensor according to claim 1 disposed on the carrier plate.

15. The MEMS package structure according to claim 14, wherein the carrier plate has an opening, and the MEMS packaging structure further comprises:
    a connecting element disposed on the opening and connected to the substrate of the MEMS acoustic sensor.

16. The MEMS package structure according to claim 15, wherein the opening is a blind hole or a through hole.

17. A manufacturing method of a MEMS acoustic sensor, comprising:
    forming a dielectric material layer on a substrate layer;
    forming a diaphragm on the dielectric material layer;
    forming a back plate on the diaphragm, wherein the diaphragm is located between the substrate layer and the back plate and comprises a vibrating portion;
    forming a second cavity on the substrate layer to form a substrate, wherein the second cavity exposes the dielectric material layer; and removing a portion of the dielectric material layer through the second cavity of the substrate to form a dielectric layer and a connecting portion, wherein the dielectric layer is located between the substrate and the diaphragm and has a first cavity corresponding to the vibrating portion, and the connecting portion is located within the first cavity and connecting the vibrating portion and the substrate;

wherein the substrate comprises a carrier portion, and the second cavity corresponds to the first cavity in position, the carrier portion protrudes relative to a sidewall of the second cavity, and the connecting portion is located between the vibrating portion and the substrate;

wherein the substrate further comprises a protrusion extending from the sidewall toward the supporting portion and connected to the supporting portion; a width of the protrusion is greater than a width of the carrier portion.

* * * * *